United States Patent
Nakamura et al.

(10) Patent No.: US 8,629,614 B2
(45) Date of Patent: Jan. 14, 2014

(54) ORGANIC EL DISPLAY AND METHOD FOR MANUFACTURING SAME

(75) Inventors: Hideyo Nakamura, Matsumoto (JP); Kohichi Hashimoto, Matsumoto (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 311 days.

(21) Appl. No.: 12/736,537

(22) PCT Filed: Jun. 23, 2009

(86) PCT No.: PCT/JP2009/061370
§ 371 (c)(1),
(2), (4) Date: Dec. 21, 2010

(87) PCT Pub. No.: WO2010/004865
PCT Pub. Date: Jan. 14, 2010

(65) Prior Publication Data
US 2011/0084290 A1    Apr. 14, 2011

(30) Foreign Application Priority Data
Jul. 10, 2008    (JP) .................... 2008-180256

(51) Int. Cl.
*H01J 33/00*    (2006.01)
(52) U.S. Cl.
USPC ........ 313/512; 257/72; 257/59; 257/E51.022; 257/40

(58) Field of Classification Search
USPC .......................................... 313/512
See application file for complete search history.

(56) References Cited

U.S. PATENT DOCUMENTS

| | | | |
|---|---|---|---|
| 6,842,211 B2* | 1/2005 | Katsura | 349/123 |
| 2005/0179377 A1* | 8/2005 | Shitagami et al. | 313/512 |
| 2005/0189878 A1 | 9/2005 | Shitagami et al. | |

FOREIGN PATENT DOCUMENTS

| | | |
|---|---|---|
| JP | 2004-288403 A | 10/2004 |
| JP | 2005-123089 A | 5/2005 |
| WO | WO-2006/054421 A1 | 5/2006 |
| WO | WO-2008/066122 A1 | 6/2008 |

* cited by examiner

*Primary Examiner* — Jerome Jackson, Jr.
(74) *Attorney, Agent, or Firm* — Rabin & Berdo, P.C.

(57) ABSTRACT

An object of this invention is to provide a top-emission type organic EL display in which filling defects of a resin filler material are alleviated during bonding of an organic EL emission panel and a color conversion filter panel with the resin filler material, as well as to provide a method for manufacturing such an organic EL display. An organic EL display of this invention is characterized in having stripe-shaped barrier walls for inkjet application placed on a color conversion filter panel, and a filler material guide wall placed between the length-direction end portions of the barrier walls for inkjet application and a peripheral seal member.

18 Claims, 22 Drawing Sheets

(Prior Art)

(Prior Art)

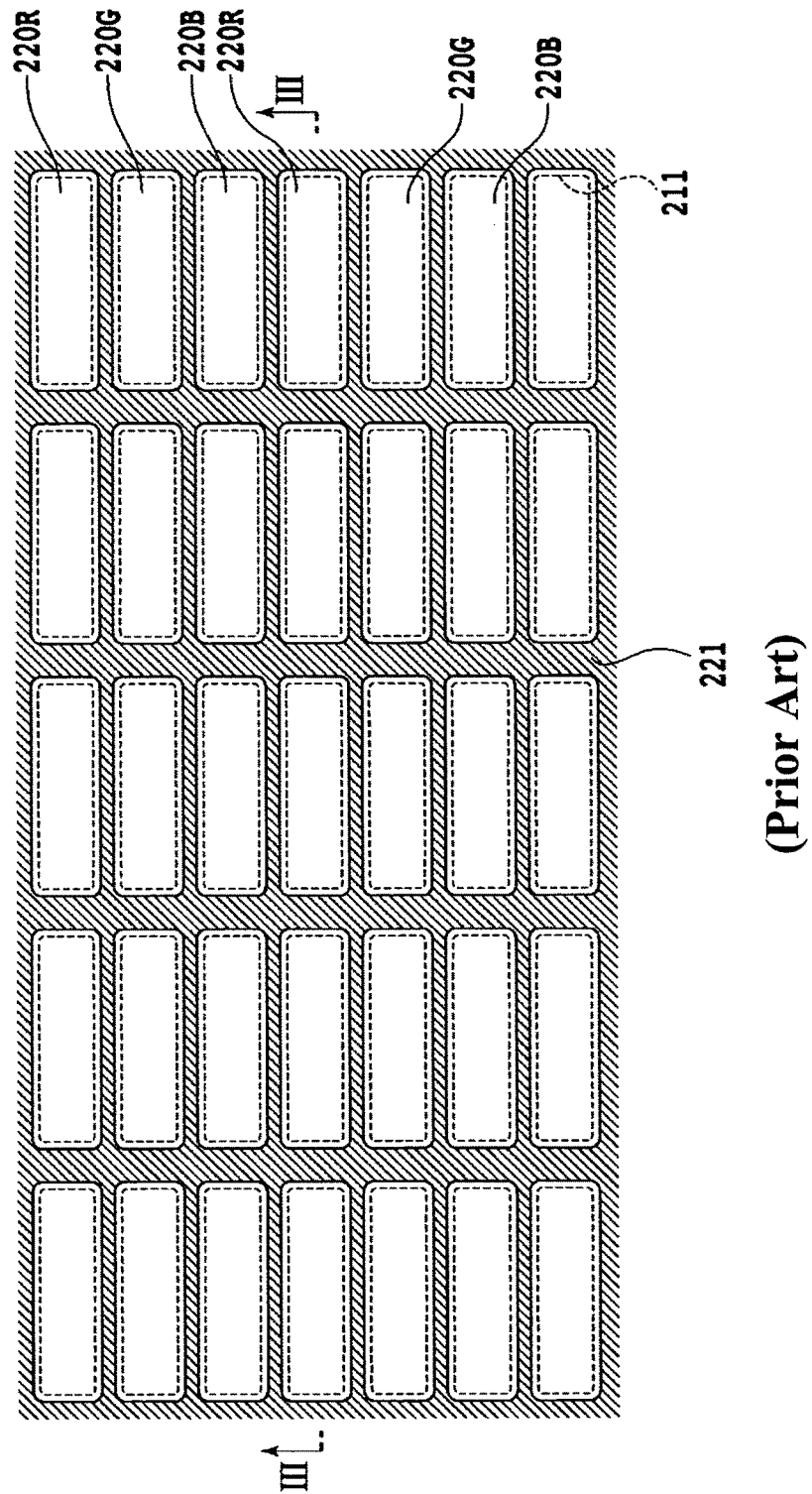

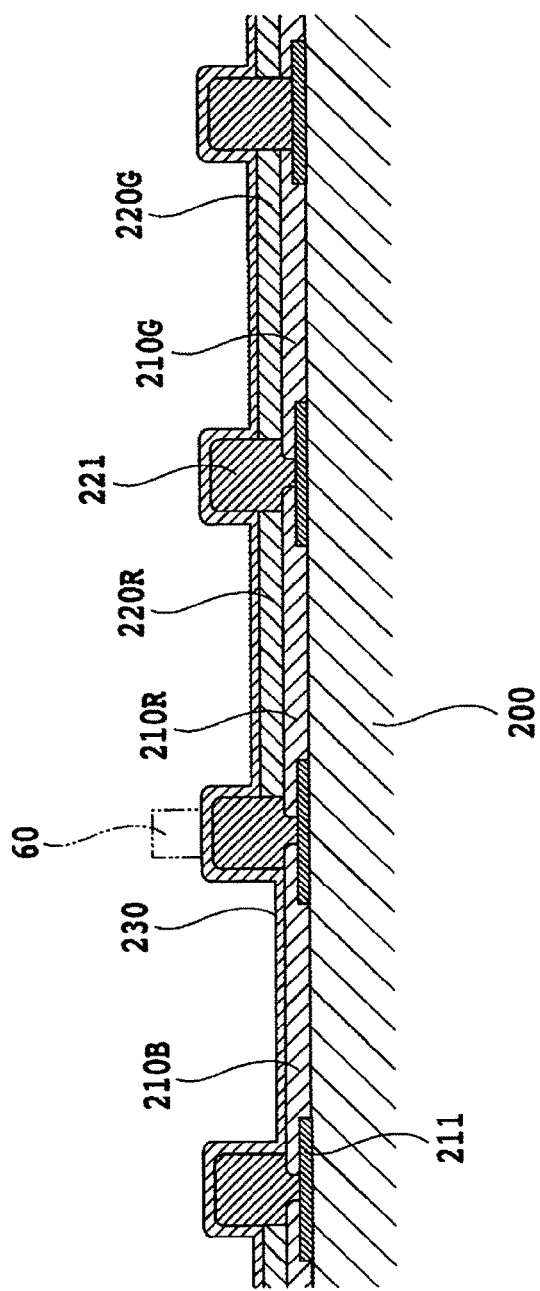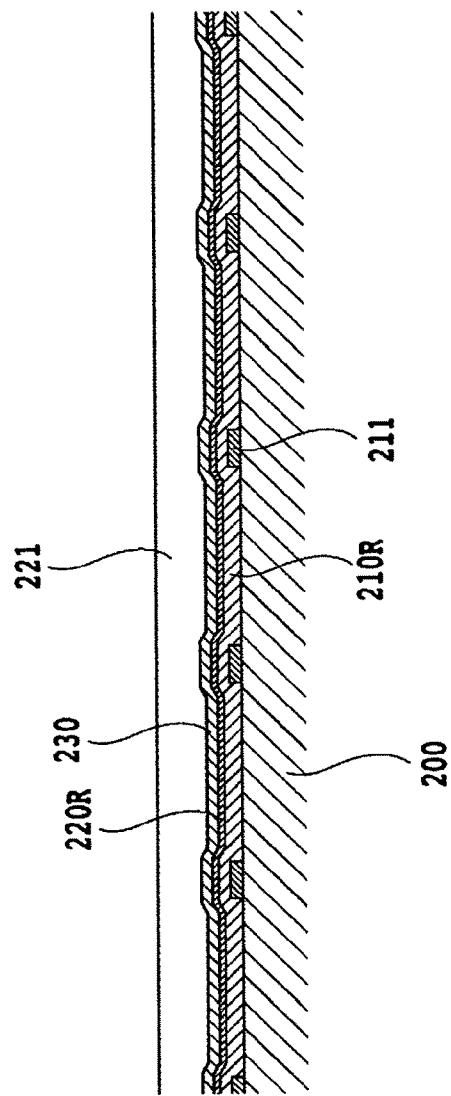

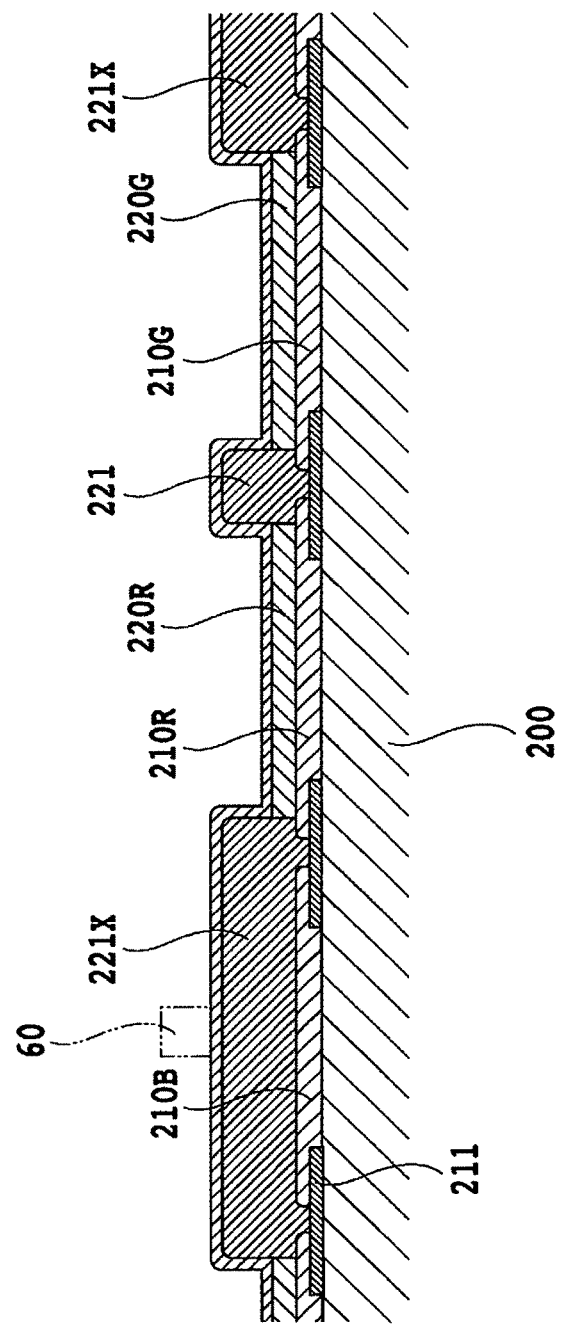

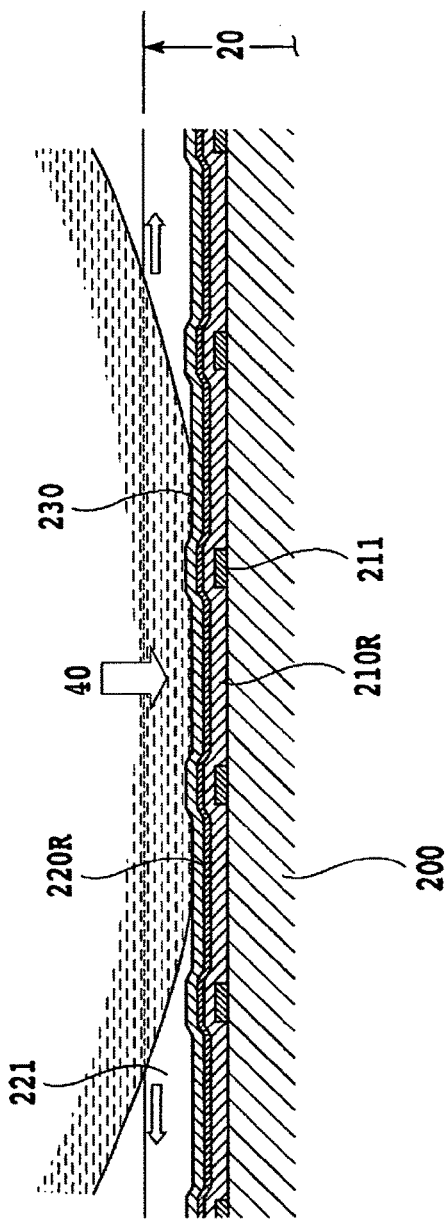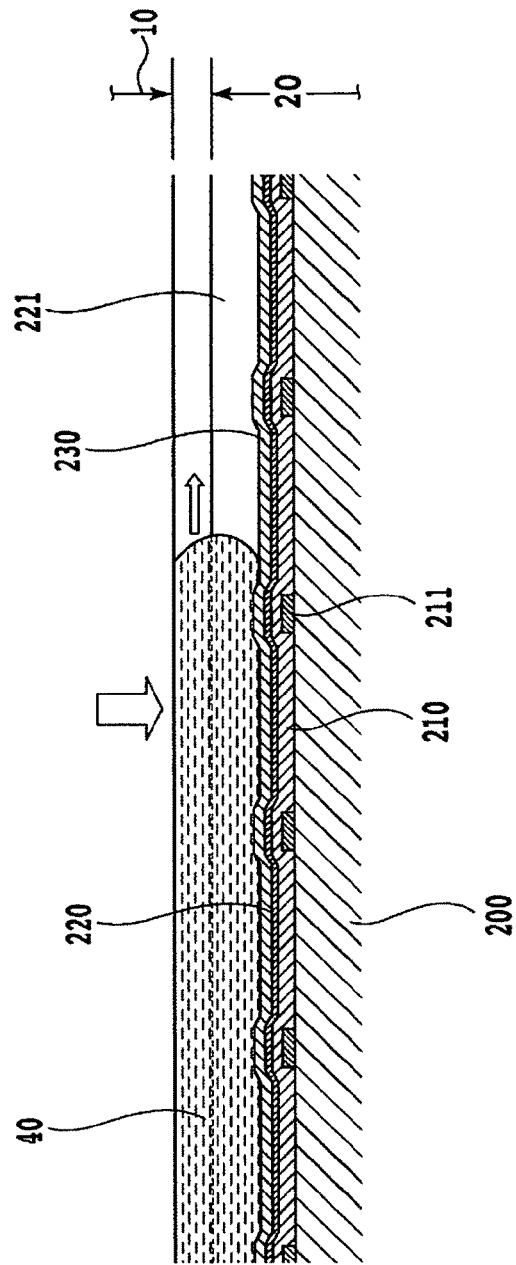

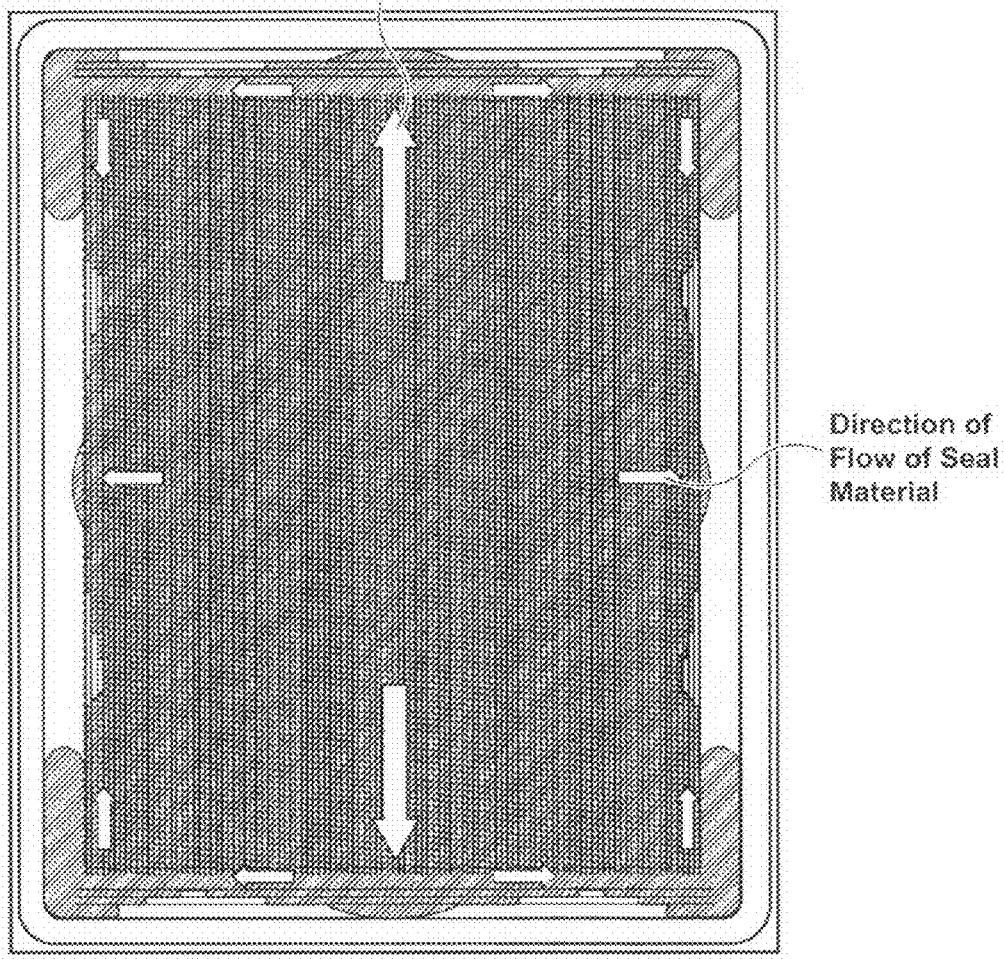

ORGANIC EL DISPLAY AND METHOD FOR MANUFACTURING SAME

TECHNICAL FIELD

This invention relates to an organic EL display. More specifically, this invention relates to a top-emission type organic EL display formed by an organic EL emission panel, and a color conversion filter panel which receives light in a prescribed wavelength range emitted by the organic EL emission panel, converts the light to light in the wavelength range of the desired chromaticity, and emits the light to a screen, as well as to the structure of the color conversion filter panel.

BACKGROUND ART

Organic EL displays known in the prior art include bottom-emission type displays, in which an organic EL emission panel is formed directly on a color conversion filter panel, and top-emission type displays, in which a separately manufactured color conversion filter panel and organic EL emission panel are bonded together, with the emission region of the organic EL emission panel and the color pattern formation region of the color conversion filter panel opposed, and with a transparent resin filler material.

As shown in FIG. 1A to FIG. 1C, an example in the prior art of a top-emission type display is configured with the emission face of an organic EL emission panel 10 opposed to the light-receiving face of a color conversion filter panel 20, bonded together with a prescribed interval maintained by spacers 60, and with the entire layered structure portion formed by the organic EL emission panel 10 and color conversion filter panel 20 sealed by a peripheral seal member (not shown).

An organic EL emission panel 10 normally is formed using a plurality of reflective electrodes 120 formed on an organic EL emission panel substrate 100 with an underlayer 110 intervening, an insulating layer 111 layered above and between the reflective electrodes 120 with opening portions provided on the reflective electrodes 120, an organic EL layer 130 including an organic emission layer layered on the opening portions and insulating layer 111 on the reflective electrodes 120, a plurality of transparent electrodes 140 facing the reflective electrodes 120 above the opening portions of the reflective electrodes 120 on the organic EL layer 130 and connected to wiring on the panel peripheral portion, and a transparent inorganic barrier layer 150 which covers the transparent electrodes 140 and organic EL layer 130.

On the other hand, as shown in FIG. 1A to FIG. 1C, a color conversion filter panel 20 is formed of a color filter 210 and black matrix 211 formed in stripe shapes on a transparent substrate 200, as well as a color conversion layer 220 layered on the color filter 210.

The peripheral portion of the organic EL emission panel 10 and color conversion filter panel 20 is sealed by a peripheral seal member, and the organic EL layer 130 and color conversion layer 220 are cut off from contact with outside air and with water in particular, and are protected. Further, in general spacers 60 are placed between the organic EL emission panel 10 and color conversion filter panel 20 for fine adjustment of the interval between the organic EL emission panel 10 and the color conversion filter panel 20.

In the prior art, in order to form the color filter 210 and color conversion layer 220 of the color conversion filter panel 20 in patterns, a photolithography method has been adopted. However, as a method enabling effective utilization of the materials used in color filters and color conversion layers, and also enabling application and fault repair in subpixel units, a formation method using an inkjet method has been proposed in Japanese Patent Application Laid-open No. 2004-288403 (see Patent Reference 1).

Further, as a method of preventing color mixing between subpixels during formation of a color filter 210 and color conversion layer 220 using an inkjet method, WO 06/54421 proposes a method in which, as shown in FIG. 2, each subpixel is enclosed by barrier walls 221 formed by a vertical-horizontal mesh-shape thick film, an inkjet method is used to cause impact of a minute amount of a dye-containing ink within each enclosed subpixel, and heating and drying are performed to form a color filter 210 and color conversion layer 220 (see Patent Reference 2). In WO 06/54421, there is no description of bonding together of a color conversion filter panel 20 and organic EL emission panel 10 with resin filler material.

In the prior art, the space between the organic EL emission panel 10 and the color conversion filter panel 20 is filled with nitrogen or another gas or inert liquid. However, whereas the refractive index of the transparent electrodes 140 is approximately 2.0, and the refractive indexes of the color conversion layer 220 and color filter 210 are approximately 1.5, the limits to the refractive indexes of nitrogen and other gases is 1.0, and the limit to the refractive indexes of inert liquids is approximately 1.3. As a result, the difference in refractive indexes of the filling gas or inert liquid and the constituent layers adjacent thereto is large, and so the efficiency of light extraction has not been very good.

In recent years, as means for improving the efficiency of light extraction, methods have generally been adopted in which epoxy-base adhesives and other transparent resins having a refractive index of 1.5 or higher, approaching the refractive indexes of the transparent electrodes 140 and barrier layers 150 of organic EL emission panels 10, and the color conversion layers 220 and color filters 210 of color conversion filter panels 20, are used for filling.

Resin filler materials comprising an epoxy-based adhesive or other transparent resin, used in bonding together an organic EL emission panel 10 and a color conversion filter panel 20, have high viscosity compared with liquid filling materials and poor spreading over the entire bonding face. When a color conversion filter panel 20 and organic EL emission panel 10 manufactured using the method described in WO 06/54421 are bonded together with a resin filler material 40, air bubbles 500 remain in regions demarcated by the barrier walls 221 at positions at which the resin filler material 40 is dropped, as shown in FIG. 3, and so the entire region in which adequate bonding is required cannot be filled with the resin filler material 40. At the portions of the air bubbles 500, the efficiency of light extraction is reduced due to the difference in refractive index, and luminance unevenness results. Also, as shown in FIG. 3, air bubbles 500 occurring in dropped portions cannot be adequately removed in vacuum due to the high viscosity of the resin filler material, and may expand and spread considerably during evacuation and during heating and hardening of the resin filler material.

Further, in methods of bonding by dropping a general liquid filler material in vacuum, adopted in bonding of liquid crystals and similar, the liquid filler material does not spread uniformly to the corners of the screen region, and there are cases in which luminance unevenness and similar occur. Specifically, as shown in FIG. 4, bonding is performed after dropping and after depressurizing the atmosphere, and so spreading of the liquid filler material can be expected to a certain extent. However, the resistance of the barrier walls 221 is considerable, and a large amount of time is required for the liquid filler material to spread to the corners of the screen region. Further, there is also the possibility that the liquid filler material may not spread completely.

Patent Reference 1: Japanese Patent Application Laid-open No. 2004-288403

Patent Reference 2: WO 06/54421

DISCLOSURE OF THE INVENTION

An object of this invention is to provide an organic EL display including, in the configuration thereof, a color conversion panel having a barrier wall structure for inkjet application that enables spreading of a resin filler material to the corners of the screen region and also enables prevention of the inclusion of air bubbles in the resin filler material when the resin filler material is used to bond an organic EL emission panel with a color conversion filter panel in which a color conversion layer is formed using an inkjet method, as well as to provide a method for manufacturing of such an organic EL display.

As a result of diligent studies to attain the above object, these inventors discovered that, by bonding a color conversion filter panel, in which barrier walls for inkjet application are placed in a stripe shape between red, (R), green (G) and blue (B) color conversion layers, and in which filler material guide walls are placed at prescribed intervals from the barrier wall end portions at both end portions in the length direction of barrier walls for inkjet application, with an organic EL emission panel with a resin filler material, resin filler material dropped into the center portion of the color filter panel spreads along the stripe-shaped barrier walls for inkjet application and filler material guide walls without including air bubbles, filling the screen region to the corners without excess or deficiency, and so perfected this invention.

A top-emission type organic EL display of this invention is formed by bonding together an organic EL emission panel and a color conversion filter panel, and is characterized in that the organic EL emission panel includes a substrate having an emission face, and a reflective electrode, an organic EL layer, and a transparent electrode that are provided on the emission face in this order; the color conversion filter panel includes a transparent substrate having a light-receiving face, and also includes, on the light-receiving face, a plurality of stripe-shaped barrier walls for inkjet application, and a color conversion layer formed between the barrier walls for inkjet application; one of the organic EL emission panel and the color conversion filter panel further includes a filler material guide wall that is placed perpendicularly to the length direction of the barrier walls for inkjet application; the organic EL emission panel and the color conversion filter panel are bonded together with a resin filler material such that the emission face and the light-receiving face are opposed; and, the periphery of the resin filler material barrier walls for inkjet application, and filler material guide wall is sealed by a peripheral seal member. Here, in an organic EL display of this invention, the resin filler material may be formed from a thermosetting transparent resin adhesive. Further, it is desirable that the barrier walls for inkjet application extend to the outside by one pixel length or more from both ends of a screen region including the color conversion layer.

Here, the filler material guide wall may be one row of a barrier wall, or a set of a plurality of rows of barrier walls. Further, the barrier wall forming the filler material guide wall may be continuous, or may be intermittent. Also, the barrier walls forming the filler material guide wall may have bent portions at both ends thereof. The bent portions are directed toward four corners of the peripheral seal member. Further, when the filler material guide wall is formed from a set of a plurality of rows of barrier walls, the length may increase from the barrier walls for inkjet application toward the peripheral seal member.

Further, in an organic EL display of this invention, it is desirable that a filler material guide wall be placed on the color conversion filter panel. In this case, the barrier walls for inkjet application and the filler material guide wall can be formed using the same material and the same process.

Further, in an organic EL display of this invention, it is desirable that the peripheral seal member be formed from a peripheral seal wall formed on either the organic EL emission panel or on the color conversion filter panel, and peripheral seal material positioned on the outside of the peripheral seal wall. Here, it is desirable that the peripheral seal wall be placed oh the color conversion filter panel. When the peripheral seal wall and the filler material guide wall are placed on the color conversion filter panel, the barrier walls for inkjet application, filler material guide wall, and peripheral seal wall can be formed using the same material and the same process.

An organic EL display manufacturing method of this invention includes: (1) a process of forming a reflective electrode, an organic EL layer, and a transparent electrode in this order on an emission face of a substrate having the emission face, to prepare an organic EL emission panel; (2) a process of preparing a color conversion filter panel, including (a) a process of forming a plurality of stripe-shaped barrier walls for inkjet application on a light-receiving face of a transparent substrate having the light-receiving face, and (b) a process of using an inkjet method to form a color conversion layer between the barrier walls for inkjet application; (3) a process of forming, on one of the organic EL emission panel and the color conversion filter panel, a filler material guide wall placed perpendicularly to the length direction of the barrier walls for inkjet application; (4) a process of forming, on one of the organic EL emission panel and the color conversion filter panel, a peripheral seal wall enclosing the barrier walls for inkjet application and the filler material guide wall; (5) a process of placing a resin filler material on one of the organic EL emission panel and the color conversion filter panel; (6) a process of applying a peripheral seal material to the outside of the peripheral seal wall; (7) a process of bonding together the organic EL emission panel and the color conversion filter panel, so that the emission face and the light-receiving face are opposed; and (8) a process of hardening the resin filler material and the peripheral seal material.

Here, the filler material guide wall may be one row of a barrier wall, or a set of a plurality of rows of barrier walls. Further, the barrier wall forming the filler material guide wall may be continuous, or may be intermittent. Also, the barrier walls forming the filler material guide wall may have bent portions at both ends thereof. The bent portions are directed toward four corners of the peripheral seal member. Further, when the filler material guide wall is formed from a set of a plurality of rows of barrier walls, the length may increase from the barrier walls for inkjet application toward the peripheral seal member.

In process (3), the filler material guide wall may be formed on the color conversion filter panel. In this case, process (2)(a) and process (3) may be performed simultaneously, and the barrier walls for inkjet application and the filler material guide wall may be formed using the same material.

Further, in process (4), the peripheral seal wall may be formed on the color conversion filter panel. When the peripheral seal wall and filler material guide wall are formed on the color conversion filter panel, processes (2)(a), (3), and (4)

may be performed simultaneously, and the barrier walls for inkjet application, filler material guide wall, and peripheral seal wall may be formed using the same material.

Further, in process (5) the resin filler material may be dropped onto one point in the center portion of one of the organic EL emission panel and the color conversion filter panel.

Further, in an organic EL display manufacturing method of this invention, a plurality of portions forming the organic EL emission panel are formed in process (1); a plurality of portions forming the color conversion filter panel are formed in process (2); and a process (9) of cutting the bonded member obtained in process (8) to obtain a plurality of organic EL displays following process (8) may further be included following process (8).

In an organic EL display of this invention, by providing the color conversion filter panel with barrier walls for inkjet application placed in a stripe shape, when the organic EL emission panel and the color conversion filter panel are bonded together, flow of the resin filler material sealed therebetween is guided by the barrier walls for inkjet application, and [the resin filler material] spreads in the length direction without including air bubbles. In addition, by positioning a filler material guide wall at both ends in the length direction of the barrier walls for inkjet application, flow of the resin filler material is guided in the width direction, and [the resin filler material] spreads without excess or deficiency to the corners of the screen region, so that substantially a perfect seal of the organic EL emission panel and the color conversion filter panel is achieved. As a result, the occurrence of luminance unevenness, arising from filling defects of the resin filler material, is prevented.

Further, as the apparatus for dropping/application of resin filler material, used in bonding the organic EL emission panel to the color conversion filter panel, an expensive high-precision mechanical measurement valve need not be used, and there is the advantage that various dispenser methods, such as comparatively inexpensive pneumatic pressure-control+syringe methods and similar, can be adopted.

BRIEF DESCRIPTION OF THE DRAWINGS

FIG. 2 is an enlarged plane view of a pixel portion of the color conversion filter panel manufactured in Comparative Example 2, belonging to the prior art;

FIG. 13 is a cross-sectional view along section line XIII-XIII of a color conversion filter panel of the invention;

FIG. 14 is a cross-sectional view along section line XIV-XIV of a color conversion filter panel of the invention;

FIG. 15 is a cross-sectional view showing another embodiment of a color conversion filter panel of the invention;

FIG. 19 is a cross-sectional view showing a state of application of resin filler material onto a color conversion filter panel of the invention;

FIG. 20 is a cross-sectional view showing the flow of resin filler material, when bonding an organic EL emission panel and a color conversion filter panel in the invention;

FIG. 21 is a plane view showing the flow of resin filler material, when bonding an organic EL emission panel and a color conversion filter panel in the invention;

EXPLANATION OF REFERENCE NUMERALS

Figure 1A:
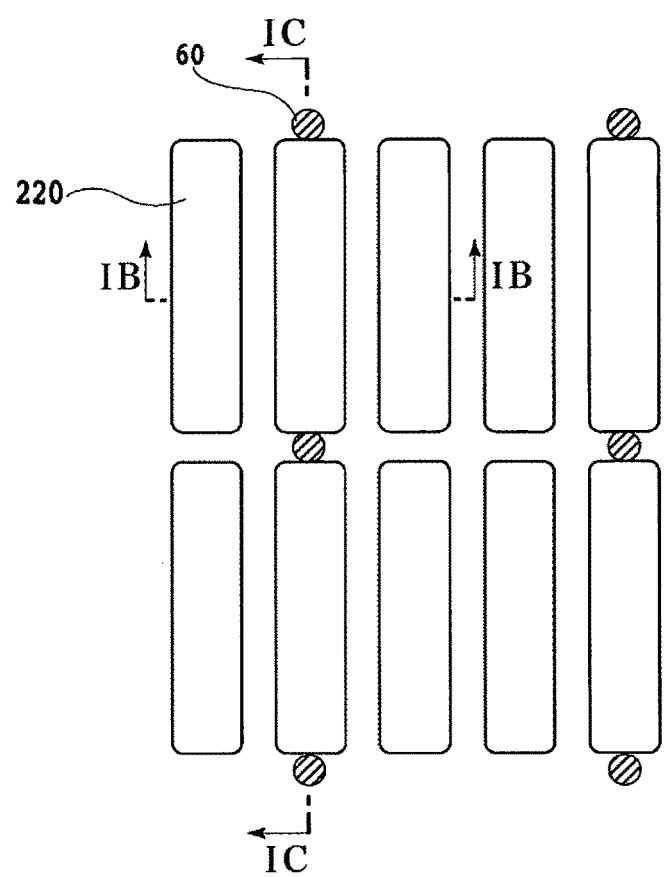
FIG. 1A is an enlarged plane view of a pixel portion of a top-emission type organic EL display of the prior art.

10 Organic EL emission panel
100 Organic EL emission panel substrate
101 Glass substrate
102 TFT structure (thin film transistor and contact hole)
103 Planarization layer
110 Underlayer
111 Insulating layer
120 Reflective electrode
130 Organic EL layer
140 Transparent electrode
150 Inorganic barrier layer
20 Color conversion filter panel
200 Transparent substrate
210 Color filter 211 Black matrix
220 Color conversion layer
221 Barrier wall for inkjet application
230 Inorganic barrier layer
30 Peripheral seal member
310 Peripheral seal wall
320 Peripheral seal material (both unhardened and hardened)
40 Resin filler material
50 Filler material guide wall
60 Spacer
70 Control IC
80 FPC mounting terminal
90 Panel internal wiring

BEST MODE FOR CARRYING OUT THE INVENTION

Figure 5A:
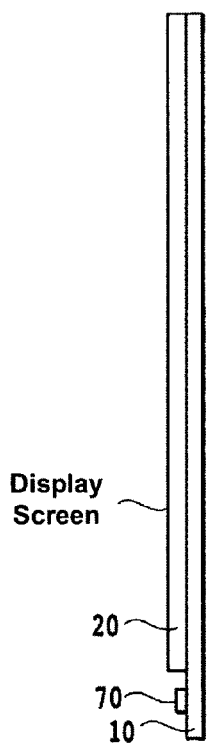
FIG. 5A is a front view of a top-emission type organic EL display of the invention.
Figure 5B:
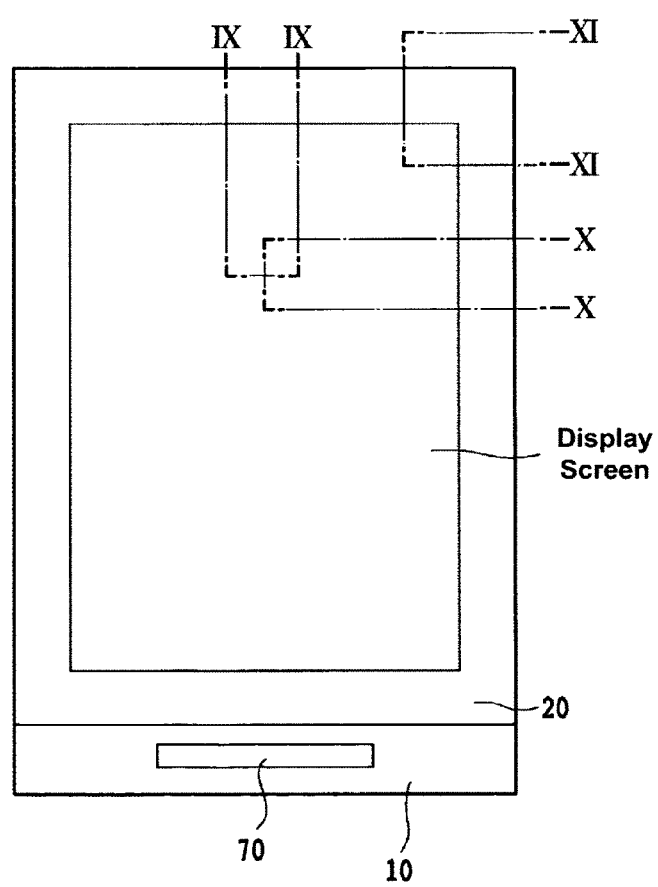
FIG. 5B is a side view of a top-emission type organic EL display of the invention.
Figure 6:
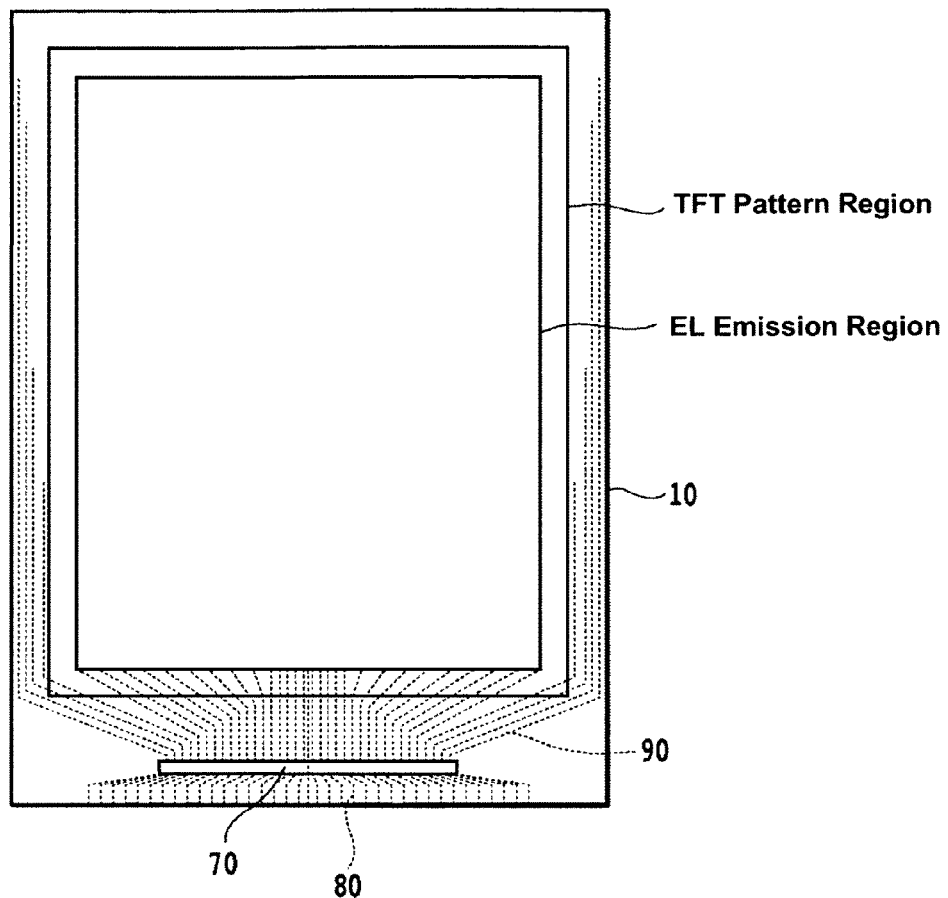
FIG. 6 is a plane view of an organic EL emission panel.
Figure 7:
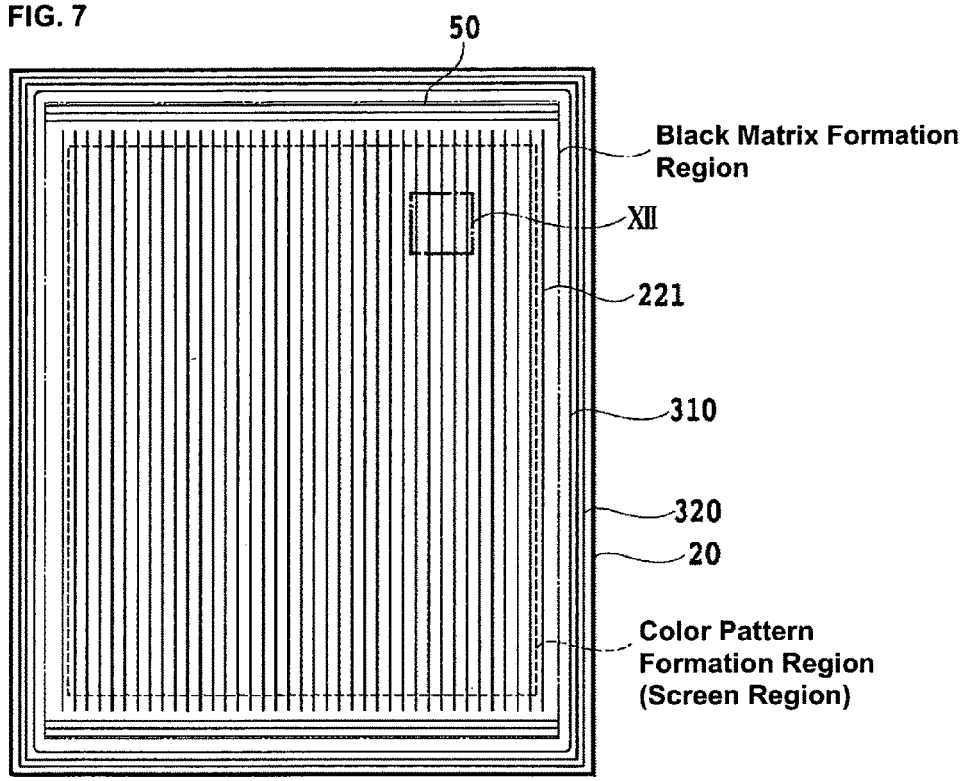
FIG. 7 is a plane view showing one embodiment of a color conversion filter panel of the invention.
Figure 8:
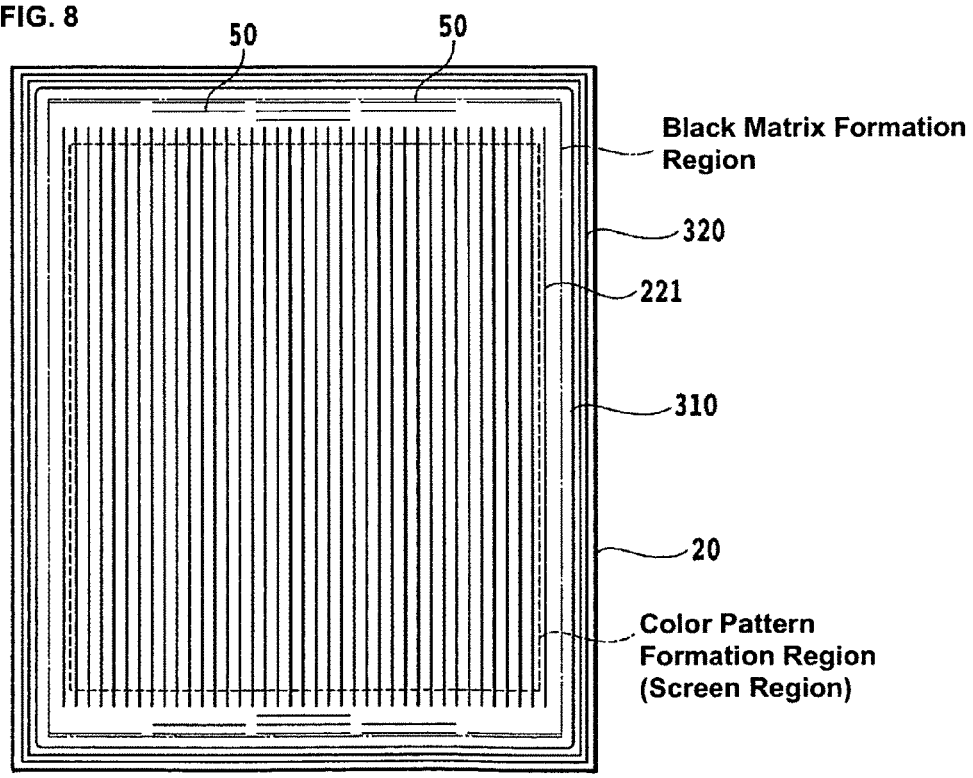
FIG. 8 is a plane view showing another embodiment of a color conversion filter panel of the invention.
Figure 9:
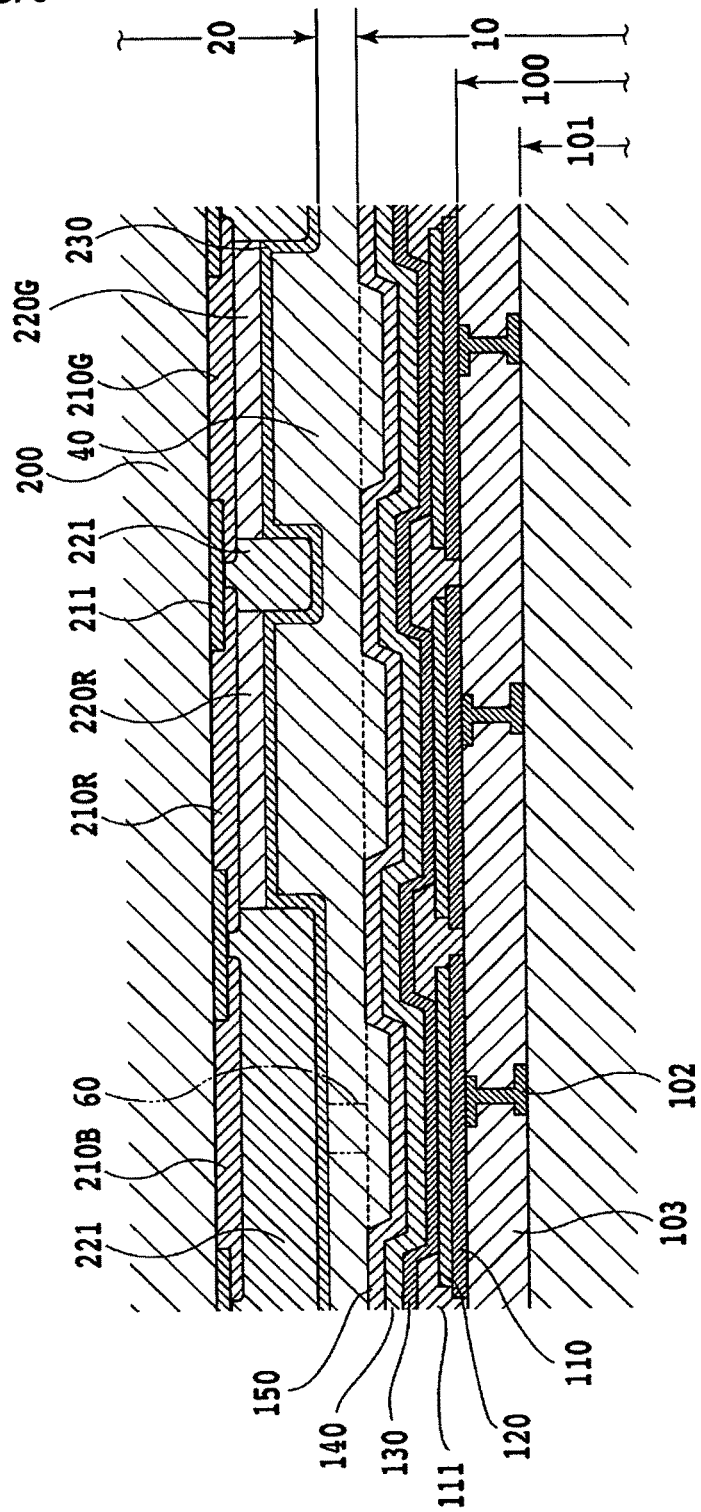
FIG. 9 is a cross-sectional view along section line IX-IX of an organic EL display of the invention.
Figure 10:
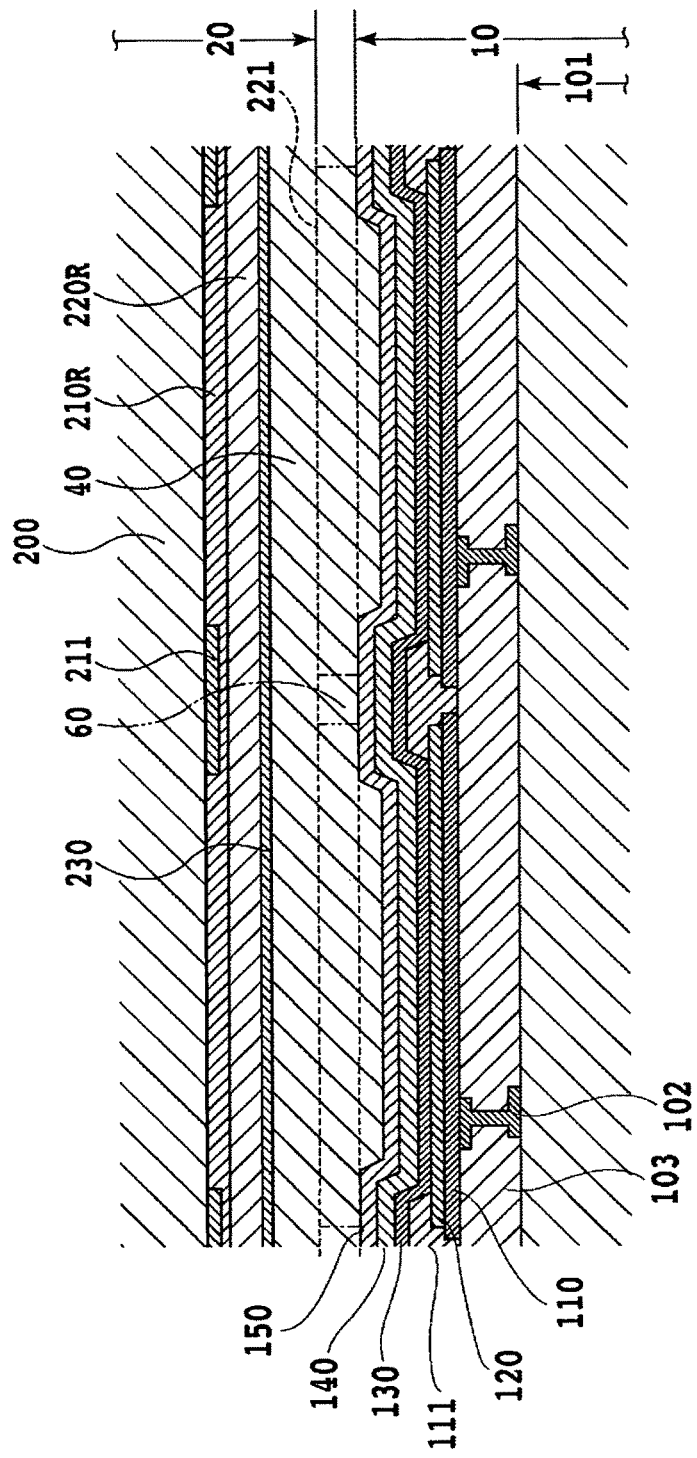
FIG. 10 is a cross-sectional view along section line X-X of an organic EL display of the invention.
Figure 11:
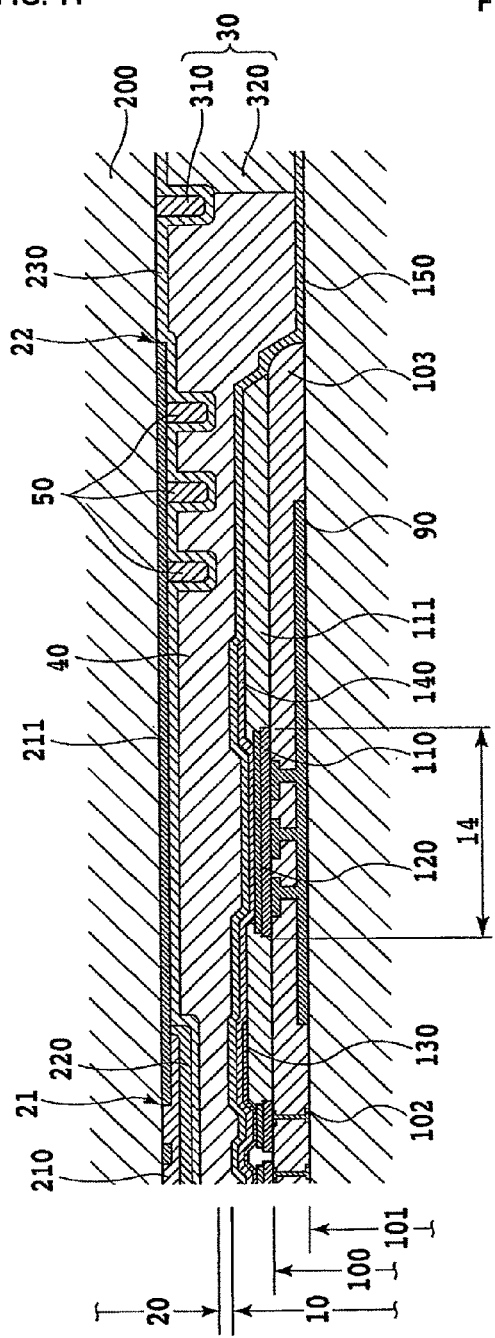
FIG. 11 is a cross-sectional view along section line XI-XI of an organic EL display of the invention.
Figure 12:
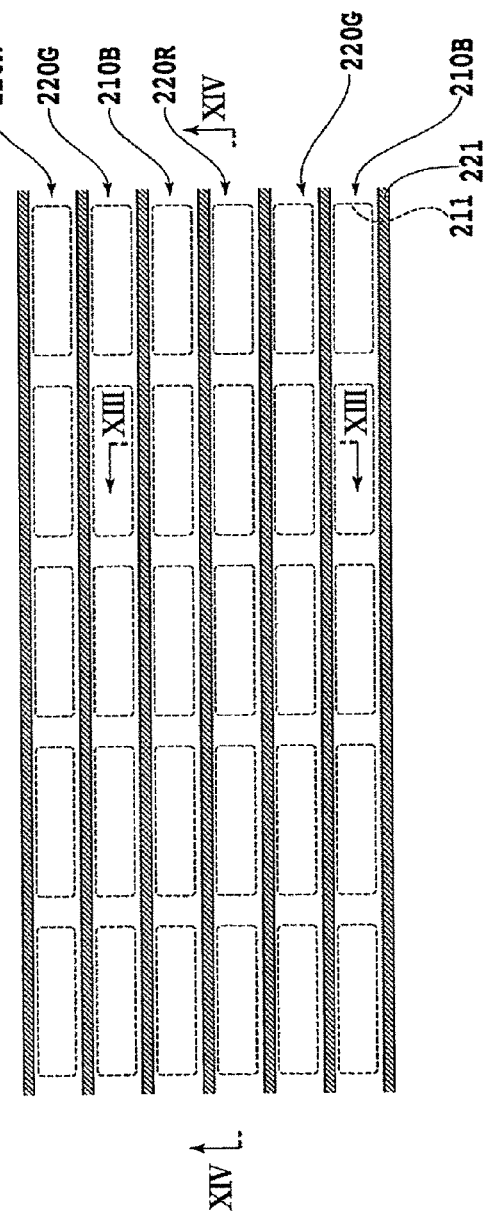
FIG. 12 is an enlarged plane view of a pixel portion of a color conversion filter panel of the invention.

An organic EL display of the invention is explained in detail based on FIG. 5A to FIG. 15. FIG. 5A is a front view of a top-emission type organic EL display of the invention, and FIG. 5B is a side view of a top-emission type organic EL display of the invention. FIG. 6 is a plane view of an organic EL emission panel 10. FIG. 7 and FIG. 8 are plane views showing embodiments of a color conversion filter panel 20 of the invention. FIG. 9 is a cross-sectional view along section line IX-IX in FIG. 5A of an organic EL display of the invention. FIG. 10 is a cross-sectional view along section line X-X in FIG. 5A of an organic EL display of the invention. FIG. 11 is a cross-sectional view along section line IX-IX in FIG. 5A of an organic EL display of the invention. FIG. 12 is an enlarged plane view of a pixel portion of a color conversion filter panel 20 of the invention. FIG. 13 and FIG. 15 are cross-sectional views of an embodiment of barrier walls for inkjet application 221 in a color conversion filter panel of the invention. FIG. 14 is a cross-sectional view in a direction parallel to barrier walls for inkjet application 221 of a color conversion filter panel of the invention.

An organic EL display of this invention is a top-emission type organic EL display in which the organic EL emission panel 10 shown in FIG. 6 and the color conversion filter panel 20 shown in FIG. 7 or FIG. 8 are bonded together, with the emission face of the organic EL emission panel 10 and the light-receiving face of the color conversion filter panel 20 opposed, as shown in FIG. 5A and FIG. 5B. This organic EL display radiates light from the face on the side opposite the color pattern formation face of the color conversion filter panel 20.

In the screen region of the color conversion filter panel 20 (see FIG. 7 and FIG. 8), as shown in the enlarged plane view of a pixel portion of a color conversion filter panel in FIG. 12, unit pixels, formed from one subpixel each of red (R), green (G) and blue (B) color filters 220R, G and B, are arranged throughout; in a preferred mode, each subpixel is delimited as an opening portion of a black matrix 211 (see FIG. 13 to FIG. 15).

(Organic EL Emission Panel)

The organic EL emission panel 10 is a panel having, on a substrate, reflective electrodes 120, organic EL layer 130, and transparent electrode 140 in this order. The organic EL emission panel 10 of this invention is formed such that EL emission light is extracted through the transparent electrode 140. The organic EL layer 130 includes an organic emission layer containing an organic compound which emits light through application of a voltage. No limitations in particular are placed on the organic EL emission panel 10, so long as the organic EL layer is formed so as to emit light in a prescribed wavelength range, preferably blue-green light in the wavelength range 400 nm to 500 nm.

A preferred configuration for such an organic EL emission panel 10 is explained based on FIG. 6 and on FIG. 9 to FIG. 11. The organic EL emission panel substrate 100 is a substrate incorporating TFTs, and is formed from TFT structures 102 (thin film transistors and similar) corresponding to subpixels on a glass substrate 101, a planarization layer 103 which planarizes the depressions and protrusions of the TFT structures 102, and when desired, an inorganic passivation layer (not shown) which covers the planarization layer 103. Here, contact holes connecting TFT structures 102 with reflective electrodes 120 are provided in the planarization layer 103 and inorganic passivation layer. In this invention, the face on which TFT structures 102 and similar are formed is called the "emission face" of an organic EL emission panel substrate 100, or the "emission face" of an organic EL emission panel 10.

The organic EL emission panel 10 is formed from the organic EL emission panel substrate 100; reflective electrode underlayer 110, connected to TFT structures 102 through contact holes; reflective electrodes 120; insulating layer 111, providing insulation of the reflective electrodes 120; organic EL layer 130, including at least an organic emission layer layered on the reflective electrodes 120 and insulating layer 111; transparent electrode 140, formed on the organic EL layer 130; and inorganic barrier layer 150, covering the organic EL layer 130 and transparent electrode 140. Further, a control IC 70, FPC mounting terminal 80, and panel internal wiring 90 may be placed on the frame portion of the glass substrate 101 outside the TFT pattern region (see FIG. 6).

On the organic EL emission panel substrate 100, the planarization layer 103 is normally formed from a resin. The inorganic passivation layer comprises a single-layer film or a layered film of a layered plurality of single-layer films of $SiO_2$, SiN, SiON, or similar, and prevents intrusion into the organic EL layer 130 and similar of outgassing from the resin forming the planarization layer 103.

The reflective electrodes 120 are formed from MoCr, CrB, Ag, an Ag alloy, or similar. In order to secure close adhesion of the reflective electrodes 120 to the planarization layer 103 or inorganic passivation layer, an underlayer 110, comprising IZO, ITO, or another oxide conductor, may be placed between the reflective electrodes 120 and the planarization layer 103 or the inorganic passivation layer. Further, a thin layer of IZO, ITO, or similar maybe placed on the reflective electrodes 120.

The insulating layer 111 is provided between reflective electrodes 120, and also covers the shoulder portions of the reflective electrodes 120. The insulating layer 111 has a plurality of opening portions corresponding to subpixels of the color conversion filter panel 20, and reflective electrodes 120 are exposed in the opening portions. The insulating layer 111 comprises $SiO_2$, SiN, SiON, or another inorganic insulating film, or an organic insulating film.

The organic EL layer 130 includes at least an organic emission layer. The organic EL layer 130 may be formed using, in addition to the organic emission layer, a layered member including an electron injection layer, electron transport layer, hole transport layer, hole injection layer, or similar. Each of these layers may be formed using well-known compounds or compositions.

The transparent electrodes 140 comprise IZO, ITO, or another transparent oxide conductive film, or a semitransparent metal film of thickness several nm to 10 nm, formed covering the entire screen region. Or, [the transparent electrodes 140] may have a stripe-shaped pattern along either the long or the short edges of the screen region, corresponding to the pattern of the reflective electrodes 120. When transparent oxide conductive film is formed by a sputtering method, in order to mitigate damage to the organic EL layer 130, a metal film (not shown) having a high optical transmissivity such as MgAg, Au or similar, of thickness several nm, may be provided on the organic EL layer 130. The transparent electrodes 140 can be connected to the panel internal wiring 90 at the terminal 14 (FIG. 11) on the peripheral portion of the EL emission region (between the edge 21 of the color pattern formation region and the edge 22 of the black matrix formation region). The terminal 14 may be formed using the above-described underlayer 110 and a reflective electrode 120 or other layer.

The inorganic barrier layer 150 is provided so as to cover the entirety of the TFT pattern region. The inorganic barrier layer 150 comprises a single layer of $SiO_2$, SiN, SiON, or similar, or a layered member of a plurality of such [single layers], and prevents intrusion into the organic EL layer 130 and similar of outgassing from the resin filler material 40 used in bonding with the color conversion filter panel 20.

(Color Conversion Filter Panel)

A preferred embodiment of the color conversion filter panel 20 is explained referring to FIG. 7 and FIG. 8, and to FIG. 12 to FIG. 15.

The color conversion filter panel 20 includes at least, on the other face of a transparent substrate 200 one face of which forms the display screen (see FIG. 5A), a color conversion layer 220 and barrier walls for inkjet application 221. Optionally, a black matrix 211 placed in a vertical-horizontal mesh shape and having rectangular opening portions as shown in FIG. 12 to FIG. 14, and/or color filters 210(R,G,B) covering opening portions provided in the black matrix 211 and placed as repetitions of red (R), green (G) and blue (B), and similar may further be included between the transparent substrate 200 and the color conversion layer 220. Here, in FIG. 12 an example of a black matrix 211 placed in a vertical-horizontal mesh shape is shown, but a black matrix 211 placed in a stripe shape along the length direction of the screen region may also be used. In this invention, the face on which the color conversion layer 40 is formed is called the "light-receiving face" of the transparent substrate 200 or the "light-receiving face" of the color conversion filter panel 20.

On the black matrix 211 between the color filters 210(R,G,B) are placed barrier walls for inkjet application 221, in stripe shapes along the length direction of the screen region, as shown in FIG. 12, FIG. 13 and FIG. 14. Using an inkjet method, color conversion layers 220(R,G) corresponding to the respective colors are layered on the red and the green color filters 210(R,G), partitioned by the barrier walls for inkjet application 221. A blue conversion layer may be layered on the blue color filter 210B as necessary.

Or, as shown in FIG. 15 (equivalent to the cross-section shown in FIG. 13), wide stripe-shaped barrier walls for inkjet application 221X may be placed covering the blue color filter 210B and reaching the black matrix 211 on both sides thereof. Further, spacers 60 may be placed as desired on the stripe-shaped barrier walls for inkjet application 221 or 221X.

In another mode, not shown, a configuration can be adopted in which the barrier walls for inkjet application 221 are placed in a stripe shape along the length direction of the screen region, either directly on the transparent substrate 200, or on the black matrix 211, an inkjet method is used to form color filters 210(R,G,B) in the gaps between the barrier walls for inkjet application 221, and an inkjet method is used to form conversion layers 220(R,G) on the red and green color filters 210(R,G). In this mode also, a blue conversion layer may be formed on the blue color filter 210B as necessary.

The transparent substrate 200 is a glass substrate, transparent plastic substrate, or other substrate having high optical transmittance, one face thereof forming the display screen, and the other face thereof being a light-receiving face on which can be formed a color conversion layer 40 and similar.

The black matrix 211 is a layer, including a matrix resin and a black color material, which absorbs visible light. A black matrix 211 with a vertical-horizontal mesh shape can be formed, and opening portions with subpixel dimensions can be delimited. The thickness of the black matrix 211 is generally approximately 1 to 2 µm. As the matrix resin, a wide range of resins can be used. Of these, it is preferable that a photosensitive resin, enabling adopting of a photolithography method in forming the black matrix pattern, be used as the matrix resin.

The color filters 210(R,G,B) are layers which selectively transmit red (R), green (G), and blue (B) light respectively. The color filters 210(R,G,B) have a stripe shape. The color filters 210(R,G,B) are placed, in RGB repetition, either directly onto the transparent substrate 200 or so as to cover the opening portions provided in the black matrix 211. The color filters 210(R,G,B) have a thickness of approximately 1 to 2 µm at positions of Contact with the transparent substrate 200. These color filters 210, similarly to the black matrix 211, include a matrix resin and color materials respectively corresponding to the RGB colors. When adopting a photolithography method in forming the color filters 210, a photosensitive resin is preferably adopted as the matrix resin. When an inkjet method is adopted in forming the color filters 210, use is not limited to a photosensitive resin, and various thermosetting resins are also adopted as the matrix resin.

The stripe-shaped barrier walls for inkjet application 221 are layers which, when an inkjet method is used to form color conversion layers 220, prevent color mixing due to splashing or leakage of the inks, which are color conversion material solutions. And, when color filters 210 are formed using an inkjet method as well, the barrier walls for inkjet application 221 have the function of preventing color mixing. The stripe-shaped barrier walls for inkjet application 221 have a width approximately sufficient to accommodate the width of the black matrix, and a height of 0.5 to 10 µm, and preferably 1 to 5 µm. The barrier walls for inkjet application 221 are formed in a stripe shape extending in the length direction of the screen region, and in addition to the length of the screen region, have lengths extending at least one pixel length, and preferably two pixel lengths or more from both of the screen region end portions. The length of a pixel is delimited by the length in the length direction of an opening portion of the vertical-horizontal mesh shape black matrix 211, by the length in the length direction of an opening portion of the insulating layer 111 (when a black matrix 211 is not provided), or by the length in the length direction of a reflective electrode 120 (when a black matrix 211 and insulating layer 111 are not provided). If the length of the stripe-shaped barrier walls for inkjet application 221 is too long, expansion of the region outside the screen region (the so-called "frame") results, which is undesirable. Further, to promote the flow of filler material, it is preferable that the end portions of the barrier walls for inkjet application 221 be open. However, when the viscosity of the ink used to form color conversion material is low, and ink leakage occurs, [the end portions] may be closed.

The material of the barrier walls for inkjet application 221 may be either an organic material or an inorganic material. In order to enable easy formation of the barrier walls for inkjet application 221 in a desired shape using a photolithography method, a photosensitive resin is particularly preferable. As inorganic materials, $SiO_2$, SiN, SiON, and similar can be used. When using an inorganic material, a dry etching method is preferably adopted as a method for obtaining barrier walls for inkjet application 221 with a desired shape.

The color conversion layers 220 are layers which convert light emitted by the organic EL emission panel 10, and preferably light having wavelengths in the blue-green region, into prescribed wavelengths corresponding to RGB colors. The color conversion layers 220 are placed on the color filter 210, and have a stripe shape, as shown in FIG. 12. The color conversion layers 220 are placed opposing subpixels of the organic EL emission panel 10. The color conversion layers 220 have a film thickness of 0.1 to 5 μm, and preferably 0.2 to 1 μm.

The color conversion layers 220 are formed by using an inkjet method to dispense ink containing an optical color conversion material, to cover the color filters 210(R,G,B), and then heating and drying the covering liquid drops. The color conversion layers 220(R,G,B) are placed in positions corresponding to the RGB colors of the color filters 210. Light emitted by the color conversion-type organic EL emission panel 10 normally has wavelengths corresponding to blue (B) to blue-green, and so there need not be a blue color conversion layer corresponding to blue (B). Or, an optically transmissive dummy layer may be provided in the positions of a blue color conversion layer.

Optionally, an inorganic barrier layer 230 may be provided so as to cover the color conversion layers 220 and lower layers. An inorganic barrier layer 230 comprises a single layer or a plurality of layers of $SiO_2$, SiN, SiON, or similar, and prevents intrusion into the color conversion layers 220 of outgassing from the resin filler material 40 used in bonding with the color conversion filter panel 20.

In the embodiment of a color conversion filter panel 20 shown in FIG. 7 and FIG. 8, a peripheral seal wall 310 forming a peripheral seal member 30 is placed enclosing the entire perimeter of the screen region of the color conversion filter panel 20. Further, a filler material guide wall 50 is placed between the peripheral seal wall 310 and the length-direction end portions of the barrier walls for inkjet application 221.

One or both of the peripheral seal wall 310 and the filler material guide wall 50 may be placed on the organic EL emission panel 10. However, the peripheral seal wall 310 and filler material guide wall 50 are normally placed on the color conversion filter panel 20. This is because it is preferable that the formation be performed in a process simultaneously with formation of the barrier walls for inkjet application 221.

As shown in FIG. 9 to FIG. 11, the organic EL emission panel 10 and color conversion filter panel 20 are bonded together, with resin filler material 40 filling the gap therebetween. Spacers 60 may be provided as necessary, to hold constant the interval between the organic EL emission panel 10 and the color conversion filter panel 20. Further, by joining the peripheral seal member 30 to both the organic EL emission panel substrate 100 and to the transparent substrate 200 of the color conversion filter panel 20, the layer-constituent region (TFT pattern region) of the organic EL emission panel 10 and the layer-constituent region (black matrix formation region) of the color conversion filter panel 20, as well as the entirety of the resin filler material layer 40, can be sealed. As a result, intrusion of outside air, and particular water, into each of the constituent layers of the organic EL emission panel 10 and of the color conversion filter panel 20 can also be prevented by the peripheral seal member 30.

Such a peripheral seal member 30 is formed by applying an unhardened peripheral seal material 320 to the outside of the peripheral seal wall 310 placed on either the organic EL emission panel substrate 100 or on the transparent substrate 200 of the color conversion filter panel 20, and after bonding together the organic EL emission panel 10 and the color conversion filter panel 20, hardening the peripheral seal material 320. In this invention, a "peripheral seal member 30" is a general term for a peripheral seal wall 310 and for an unhardened or hardened peripheral seal material 320. The peripheral seal wall 310 is a layer to prevent intrusion of the peripheral seal material 320 into the EL emission region of the organic EL emission panel 10 and/or into the screen region of the color conversion filter panel 20, and to delimit the inner edge of the peripheral seal member 30. It is preferable that the peripheral seal wall 310 employ the same material as the barrier walls for inkjet application 221 and the filler material guide wall 50, and be formed in a process simultaneously with these. As the peripheral seal material 320, for example a UV-hardening adhesive can be used.

The resin filler material 40 comprises a thermosetting resin with excellent transmissivity and having adhesion enabling close contact with both the surface of the organic EL emission panel 10 (for example, the inorganic barrier layer 150 in the configuration of FIG. 9) and with the surface of the color conversion filter panel 20 (for example, the inorganic barrier layer 230 in the configuration of FIG. 9), such as for example an epoxy-system resin adhesive or similar. The resin filler material 40 completely fills the inside of the peripheral seal wall 310, that is, the TFT pattern region of the organic EL emission panel 10 and the corresponding black matrix formation region of the color conversion filter panel 20.

The filler material guide wall 50 is formed from a photosensitive resin. As shown in FIG. 21, during bonding of the organic EL emission panel 10 and the color conversion filter panel 20, the resin material guide wall 50 causes flow of the resin filler material 40, guided along the stripe-shaped barrier walls for inkjet application 221, in directions perpendicular to the barrier walls for inkjet application 221, and guides the resin filler material 40 to the corners of the filled region.

The filler material guide wall 50 is formed in the direction perpendicular to the stripe-shaped barrier walls for inkjet application 221, that is, in the width direction of the screen region. In addition to the entire width of the screen region, the filler material guide wall 50 extends at least one pixel length, and preferably two or more pixel lengths, from each of the end portions. The length of a pixel is delimited by the length in the length direction of an opening portion of the vertical-horizontal mesh shape black matrix 211, by the length in the length direction of an opening portion of the insulating layer 111 (when a black matrix 211 is not provided), or by the length in the length direction of a reflective electrode 120 (when a black matrix 211 and insulating layer 111 are not provided).

The filler material guide wall 50 may be one row of a barrier wall. However, in order to more efficiently guide the resin filler material, it is desirable that the filler material guide wall 50 be a set of a plurality of rows of barrier walls. In consideration of the function of guiding the resin filler material and prevention of expansion of the inner edge region of the screen region (the so-called "frame"), it is preferable that the resin material guide wall 50 be a set of from two to ten rows of barrier walls, and still more preferably a set of two to three rows of barrier walls. The filler material guide wall 50, or the barrier walls forming same, may each be continuous, or may be intermittent. FIG. 7 shows an example of the configuration of a filler material guide wall 50 comprising a set of three rows of continuous barrier walls. FIG. 8 shows an example of the configuration of a filler material guide wall 50 comprising a set of three rows of intermittent barrier walls. As shown in FIG. 8, it is also possible to adopt a configuration in which the number of rows of barrier walls in the center portion of the screen region, in which the resin filler material 40 is dropped, is made large, and the number of barrier wall rows is decreased near the end portions of the screen region.

Further, in a filler material guide wall 50 comprising a set of a plurality of rows of barrier walls, it is preferable that the lengths of the barrier walls be increased in sequence from the inside rows (on the side of the barrier walls for inkjet application 221) toward the outside rows (on the side of the peripheral seal wall 310). By this means, the resin filler material 40 can be more efficiently guided toward the vertices of the peripheral seal wall 310 (that is, the four corners of the region to be filled by the resin filler material 40).

Figure 22:
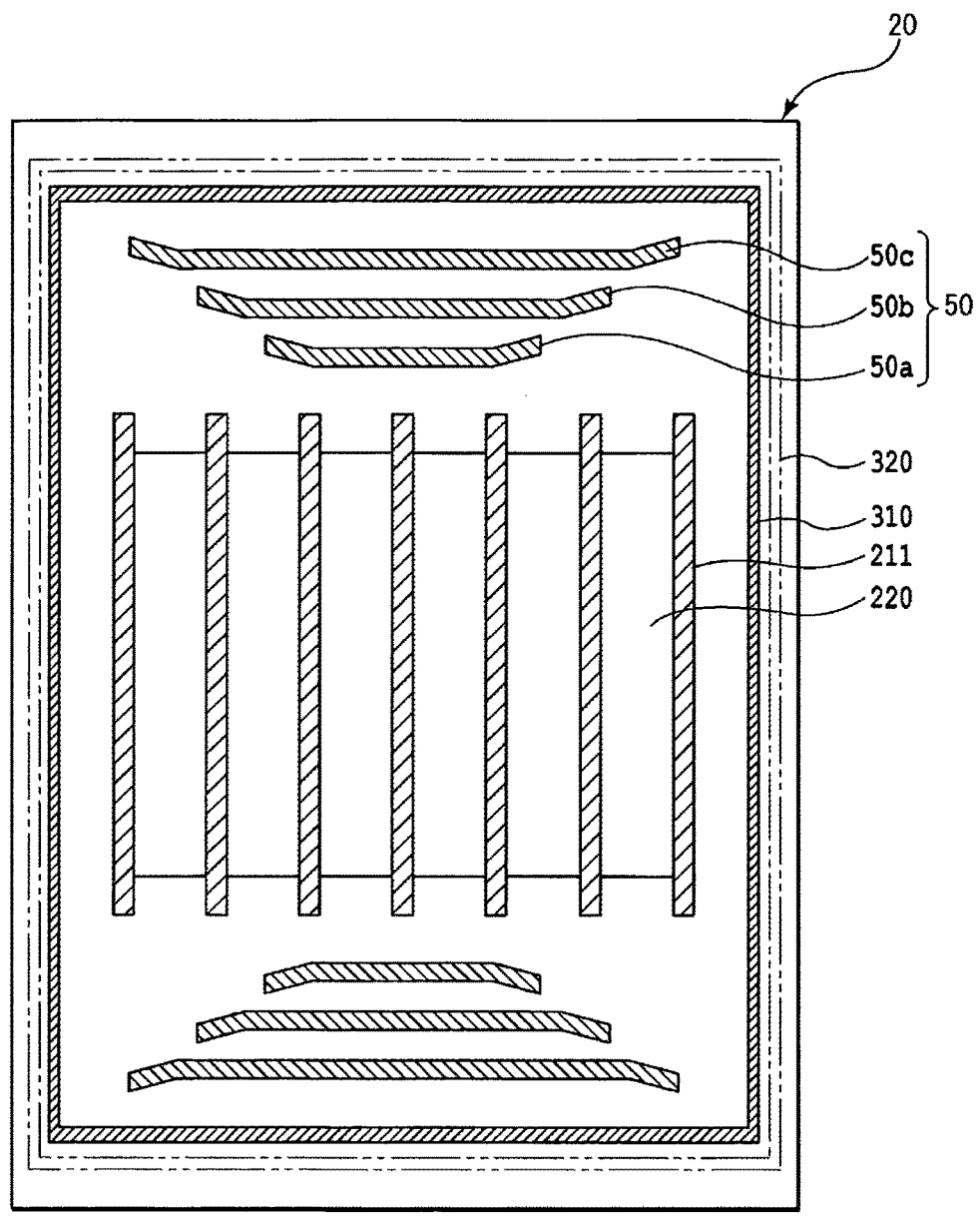
FIG. 22 shows another embodiment of a color conversion filter panel of the invention.
Figure 23:
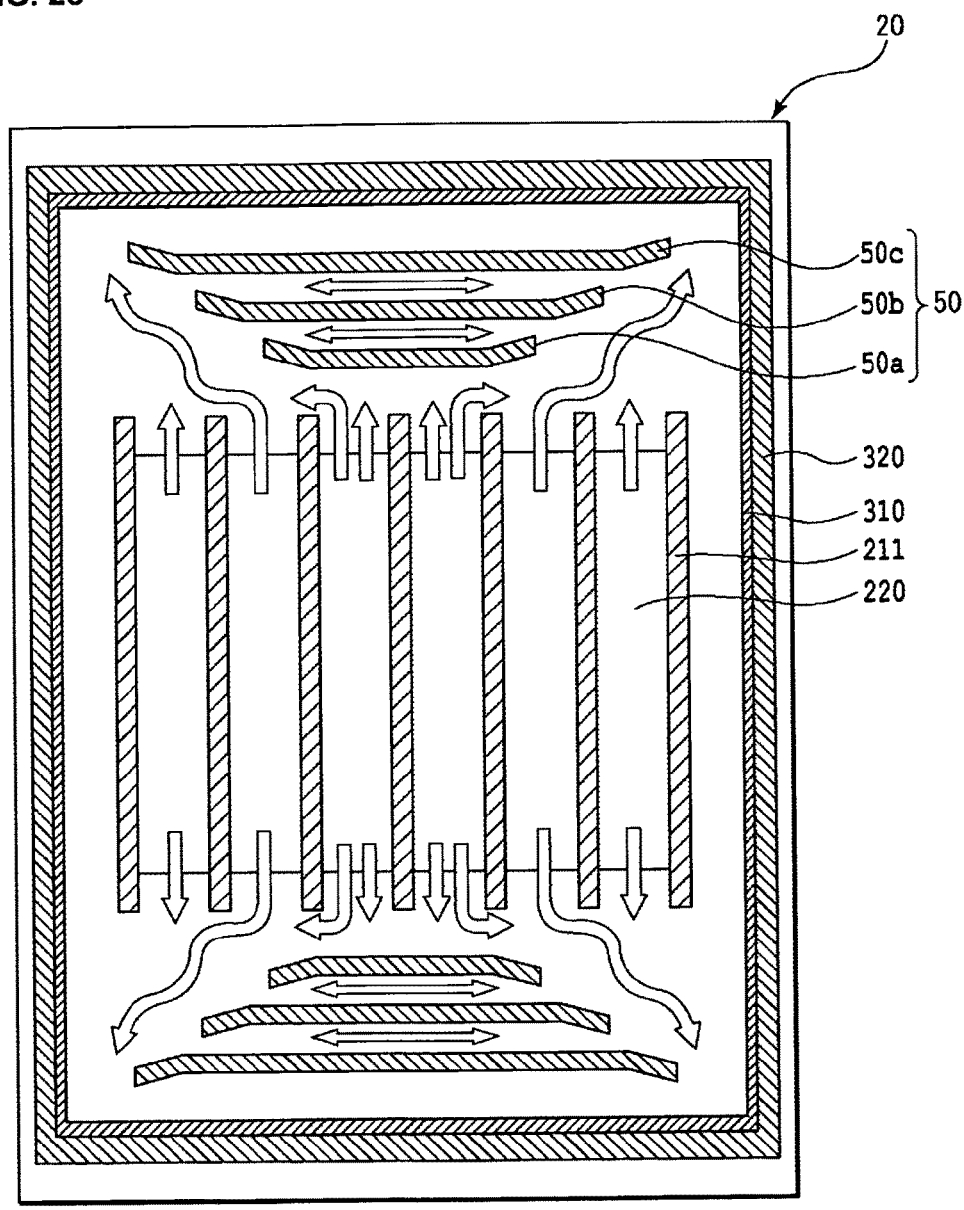
FIG. 23 is a plane view showing the flow of resin filler material, when bonding an organic EL emission panel and a color conversion filter panel in the invention.

Further, in the above-described configuration, bent portions may be provided at each of the end portions of the barrier walls forming the filler material guide wall 50. Bent portions are placed directed toward the vertices (that is, the four corners of the region to be filled) of the peripheral seal wall 310. When using a plurality of rows of barrier walls having bent portions, it is desirable that a placement be adopted in which the lengths of the barrier walls are increased in sequence from the inside rows toward the outside rows, so that the bent portions of the barrier walls in the rows do not overlap. FIG. 22 shows an example of the configuration of a filler material guide wall 50 comprising three barrier walls 50a to c having bent portions. When using a filler material guide wall 50 comprising straight-line barrier walls, shown in FIG. 7 and FIG. 8, liquid accumulation of the resin filler material 40 may occur at the end portions. There is the concern that this liquid accumulation may cause unevenness in the thickness of the resin filler material 40, particularly when using a high-viscosity resin filler material 40. Flow of the resin filler material 40 when performing bonding using the configuration of FIG. 22 is explained referring to FIG. 23. The resin filler material 40 guided by the barrier walls for inkjet application 221 first reaches the short barrier wall 50a furthest on the inside, and is guided in width directions. When the resin filler material 40 reaches the bent portions at the end portions of the barrier wall 50a, the resin filler material 40 is guided toward vertices of the peripheral seal wall 310. This is because a flow path is secured in diagonal directions by the bent portions of the barrier wall 50a. Similar guidance is performed at the longer barrier walls 50b and 50c on the outside, and the resin filler material 40 flows smoothly toward the vertices of the peripheral seal wall 310. Due to the above-described effect, even when a resin filler material 40 of high viscosity (for example, approximately 200 to 500 mPa·s) is used, the resin filler material 40 flows with uniform thickness, and can satisfactorily fill the region surrounded by the peripheral seal wall 310. The configuration of FIG. 22 is also effective for resin filler materials 40 currently in widespread use with lower viscosities (for example, approximately 100 to 200 mPa·s).

It is preferable that the filler material guide wall 50 be formed in the same process in which the barrier walls for inkjet application 221 are formed. In this case, the filler material guide wall 50 has the same height as the barrier walls for inkjet application 221. The filler material guide wall 50 has a width of 4 to 100 μm, and preferably 6 to 20 μm. When forming the filler material barrier wall 50 from a plurality of barrier walls, it is desirable that the intervals between the barrier walls be approximately equal to the pixel pitch. Of course, the filler material guide wall 50 may be manufactured in a separate process.

Figure 26:
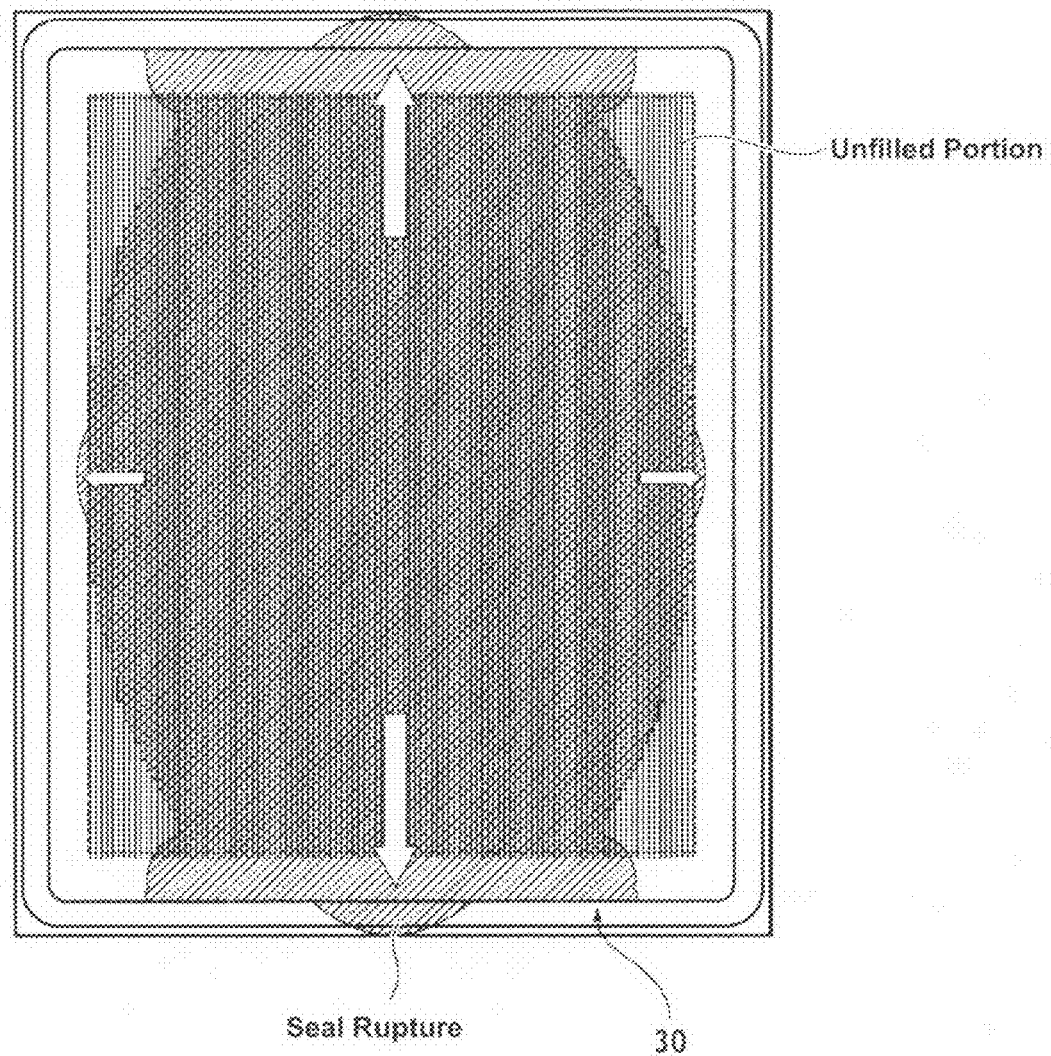
FIG. 26 is a plane view showing the flow of filler material, when bonding an organic EL emission panel and a color conversion filter panel in Comparative Example 1.

When there is no filler material guide wall 50, filling defects may occur at the four corners of the region filled by the resin filler material 40 (that is, the inside of the peripheral seal wall 310), or so-called "seal rupture", in which filler material 40 passes the peripheral seal wall 30 and leaks outside, may occur as shown in FIG. 26.

A method for manufacturing an organic EL display of this invention includes:

(1) a process of forming a reflective electrode, an organic EL layer, and a transparent electrode in this order on an emission face of a substrate having the emission face, to prepare an organic EL emission panel;

(2) a process of preparing a color conversion filter panel, including (a) a process of forming a plurality of stripe-shaped barrier walls for inkjet application on a light-receiving face of a transparent substrate having the light-receiving face, and (b) a process of using an inkjet method to form a color conversion layer between the barrier walls for inkjet application;

(3) a process of forming, on one of the organic EL emission panel and the color conversion filter panel, a filler material guide wall placed perpendicularly to the length direction of the barrier walls for inkjet application;

(4) a process of forming, on one of the organic EL emission panel and the color conversion filter panel, a peripheral seal wall enclosing the barrier walls for inkjet application and the filler material guide wall;

(5) a process of dropping a resin filler material onto one of the organic EL emission panel and the color conversion filter panel;

(6) a process of applying peripheral seal material to the outside of the peripheral seal wall;

(7) a process of bonding together the organic EL emission panel and the color conversion filter panel, so that the emission face and the light-receiving face are opposed; and (8) a process of hardening the resin filler material and the peripheral seal material, and forming a peripheral seal member including the peripheral seal wall and the peripheral seal material.

The process (1) of formation of the organic EL emission panel 10 can include, in order, (a) a process of forming reflective electrodes 120 on an organic EL emission panel substrate 100; (b) a process of forming an insulating layer 111 on the reflective electrode 120; (c) a process of layering an organic EL layer 130 on the reflective electrodes 120; (d) a process of forming a transparent electrode 140 on the organic EL layer 130; and (e) a process of covering the organic EL layer 130 and transparent electrode 140 with an inorganic barrier layer 150. No limitations in particular are imposed on any of the above-described processes. Of the above-described processes, processes (a), (c) and (d) are required processes, and processes (b) and (e) are optional processes.

An organic EL emission panel substrate 100 with the TFT structure 102 shown in FIG. 9 to FIG. 11 fabricated can be manufactured by a method including a process of fabricating a TFT structure 102 on a glass substrate 101; a process of adding a planarization layer 103 onto the glass substrate 101 on which the TFT structure 102 is fabricated, to planarize the depressions and protrusions in the substrate surface due to the TFT structure 102; a process of covering the planarization layer 103 with an inorganic passivation layer; and, a process of providing a contact hole (not shown) in the planarization layer 103 and inorganic passivation layer, connecting the TFT structure 102 and reflective electrodes 120.

In the process (a) of forming the reflective electrodes 120, a method is adopted in which an underlayer 110 and the reflective electrodes 120 are layered, in sequence, on the organic EL emission panel substrate 100 using a photo process. Next, in the process (b) of forming the insulating layer 111, either a method of forming an organic insulating film on the reflective electrodes 120 and using a photolithography method to form opening portions forming subpixels to obtain the insulating layer 111, or, a method of forming an inorganic insulating film on the reflective electrodes 120 and between the reflective electrodes 120, after which etching is used to form opening portions over the reflective electrodes 120 to obtain the insulating layer 111, is adopted.

In the process (c) of layering and forming the organic EL layer 130, a method is adopted in which a vacuum evaporation deposition method is used to layer, in sequence, each of the layers forming the organic EL layer 130. In the process (d) of forming the transparent electrode 140, a method can be adopted in which a sputtering method is used to pattern and form the transparent electrode 140. In the following process (e) of forming the inorganic barrier layer 150, a general method of inorganic thin film formation, such as for example a CVD method, sputtering method, or similar, can be adopted.

The process (2) of manufacturing the color conversion filter panel 20 shown in FIG. 12 to FIG. 15 includes, as required processes, (a) a process of forming barrier walls for inkjet application 221, and (b) a process of using an inkjet method to layer color conversion layers 220 on the color filters 210. The process (2) can further include, as optional processes, (c) a process of forming color filters 210, (d) a process of forming a black matrix, and (e) a process of forming an inorganic barrier layer 230.

The barrier walls for inkjet application 221 and color filters 210 may be formed directly on the transparent substrate 200. Or, after forming a black matrix 211 on the transparent substrate 200, the color filters 210 may be formed in a stripe shape so as to cover the opening portions of the black matrix 211, and the barrier walls for inkjet application 221 may be formed on the black matrix 211 between the color filters 210. Normally, the latter is preferably adopted.

Further, after forming barrier walls for inkjet application 221 either directly on the transparent substrate 200 or on a black matrix 211 formed on the transparent substrate 200, an inkjet method may be used to form the color filters 210 between the barrier walls for inkjet application 221.

In the process (d) of forming a black matrix 211 and the process (c) of forming color filters 210, normally a photolithography method is adopted, and in formation of barrier walls for inkjet application 221 which follows also, a photolithography method is preferably adopted.

It is most common for the process (2) of manufacturing the color conversion filter panel 20 to be executed by forming, on the transparent substrate 200, (d) a black matrix 211-(c) color filters 210-(a) barrier walls for inkjet application 221-(b) color conversion layers 220 in this order. As another method, the order (d) black matrix 211-(a) barrier walls for inkjet application 221-(c) color filters 210-(b) color conversion layers 220, or the order (c) color filters 210-(a) barrier walls for inkjet application 221-(b) color conversion layers 220, or the order (a) barrier walls for inkjet application 221-(c) color filters 210-(b) color conversion layers 220, may be adopted.

In the process (3) of forming the filler material guide wall 50 and the process (4) of forming the peripheral seal wall 310, normally a photolithography method is adopted. Hence when one or both of the peripheral seal wall 310 and the filler material guide wall 50 are placed on the transparent substrate 200 of the color conversion filter panel 20, it is preferable that these be formed in a process simultaneously with the process (2)(a) of forming the barrier walls for inkjet application 221.

The process (5) of placing the resin filler material 40 on the color conversion filter panel 20 need only result in placement such that, when bonding the organic EL emission panel 10 and the color conversion filter panel 20, uneven distribution of the spreading of the resin filler material 40 does not readily occur, and in particular, uneven distribution of the spreading of the resin filler material 40 in directions perpendicular to the barrier walls for inkjet application 221 does not readily occur. In this invention, due to the guidance effect of the barrier walls for inkjet application 221 and the filler material guide wall 50, placement of a central single point for dropping the resin filler material 40 in the center portion of the screen region, shown in FIG. 16, can be adopted. In this invention, as shown in FIG. 19, the barrier walls for inkjet application 221 have a stripe shape, and so when dropping the resin filler material 40 there is no inclusion of air bubbles. Or, depending on the characteristics of the resin filler material 40 and similar, the linear placement perpendicular to the barrier walls for inkjet application 221 shown in FIG. 17, or the multiple-point placement shown in FIG. 18, can also be adopted.

For example, when the barrier walls for inkjet application 221 and filler material flow wall 50 shown in FIG. 7 are formed, the resin filler material 40 spreads along the barrier walls for inkjet application 221, and upon reaching the filler material guide wall 50, the flow direction is guided in directions perpendicular to the pattern of the barrier walls for inkjet application 221, so that at least the screen region interior is reliably filled, as shown in FIG. 20 and FIG. 21. The size of the arrows in FIG. 21 indicates the ease of flow of the resin filler material 40.

The amount of resin filler material 40 dropped/applied is determined at the time of bonding of the two panels, taking into account the volume within the peripheral seal member 30 and hardening shrinkage of the resin filler material 40.

The method of placement of the resin filler material 40 on the color conversion filter panel 20 can be selected appropriately from among dropping, application, or similar, according to the type and viscosity of the resin filler material 40. In particular, a dropping/application method with good measurement precision is preferably adopted. As the dropping/application device, it is preferable that a high-precision mechanical measurement valve, the dispensed amount of which changes little with the viscosity of the resin filler material 40, be used. However, depending on the flow pattern of the resin filler material 40, various dispenser methods such as a pneumatic pressure-control+syringe method or similar, which are less expensive than a mechanical measurement valve, and which do not tend to result in inclusion of air bubbles in the resin filler material 40, can be adopted.

When the amount of resin filler material 40 which is dropped/applied is insufficient, a void remains outside the screen region. However, as explained below, bonding is performed in a depressurized state, so that gas in a depressurized state exists in this void. After returning the outside to normal pressure following bonding, this remaining gas does not expand sufficiently to rupture the peripheral seal member 30 under conditions in which the resin filler material 40 is heated and hardened. Further, even when the amount of resin filler material 40 which is dropped/applied is excessive, the filler material guide wall 50 and peripheral seal wall 310 suppress seepage of the resin filler material 40 to outside the peripheral seal member 30. Hence in place of a dropping/application device with highly precise measurement, various dispenser methods can be adopted, with little inclusion of air bubbles even when measurement precision is low.

The process (6) of applying unhardened peripheral seal material 320 can be performed using a mechanical measurement valve, various dispensers, or other dropping/application devices.

The process (7) of bonding together the two panels is performed by bringing the two panels into proximity in vacuum, in parallel, to from 10 to 100 μm; causing the unhardened peripheral seal material 320 placed on the outside of the peripheral seal wall 310 to come into contact with both panels; performing positioning using an alignment device; irradiating the unhardened peripheral seal material 320 with light to cause temporary hardening and seal the interior of the peripheral seal material 320; and gradually returning the system to normal pressure, to effect pressure welding of the two panels. The unhardened peripheral seal material 320 is pressed toward both the inside and the outside when the two panels make contact and the distance between the panels is shortened. Movement of the peripheral seal material 320 toward the inside is stopped by the peripheral seal wall 310. The amount of adhesion of the peripheral seal material 320 is controlled such that the peripheral seal material 320 does not reach the end portions of the two panels.

Next, as process (8), the two pressure-welded panels are heated, and the resin filler material 40 and peripheral seal material 320 are hardened, to obtain an organic EL display of this invention. Here, a peripheral seal member 30 is formed from the peripheral seal wall 310 and the hardened peripheral seal material 320.

Figure 24:
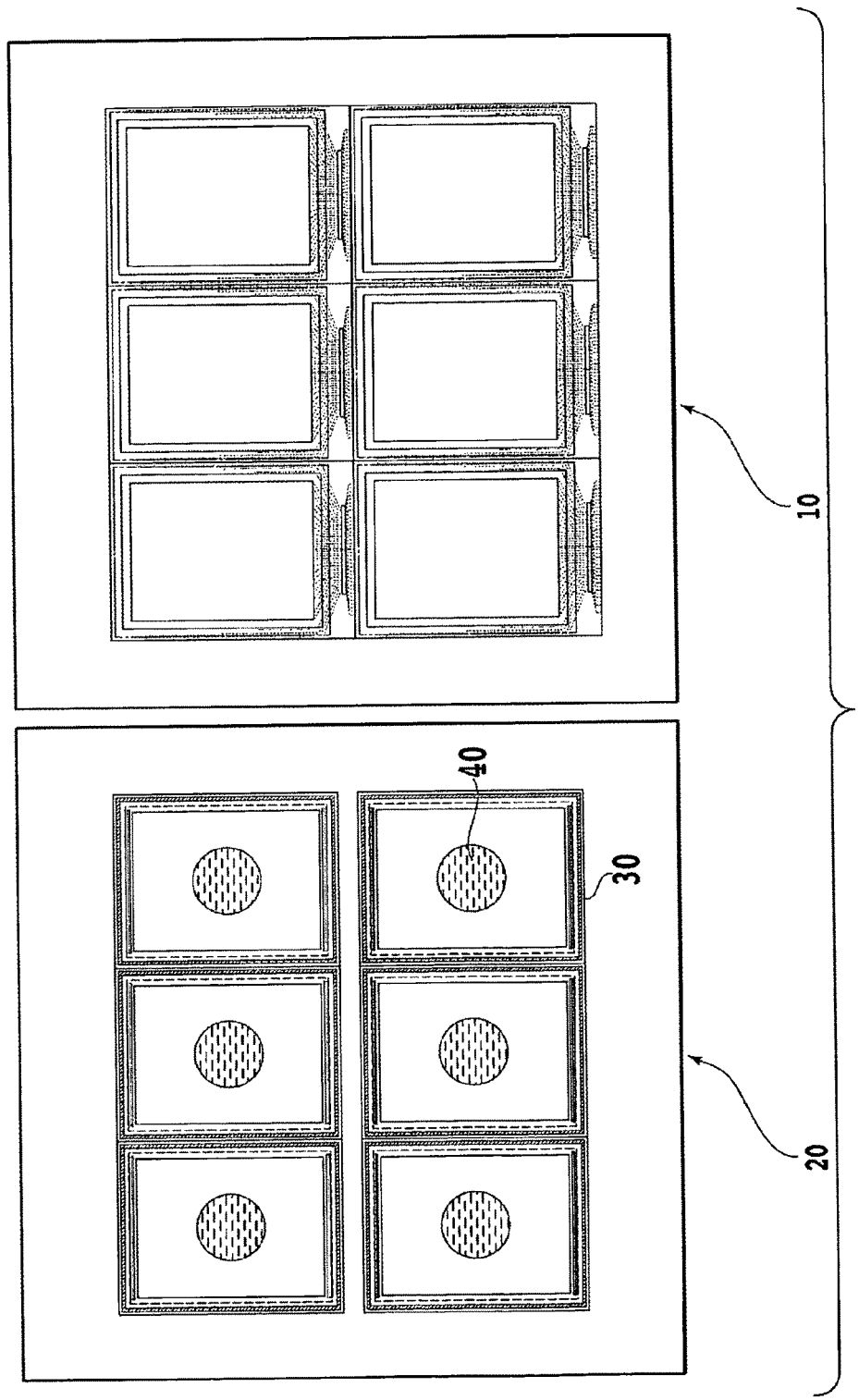
FIG. 24 is a plane view of organic EL emission panels and color conversion filter panels, used in multi-panel manufacturing of organic EL displays of the invention.
Figure 25:
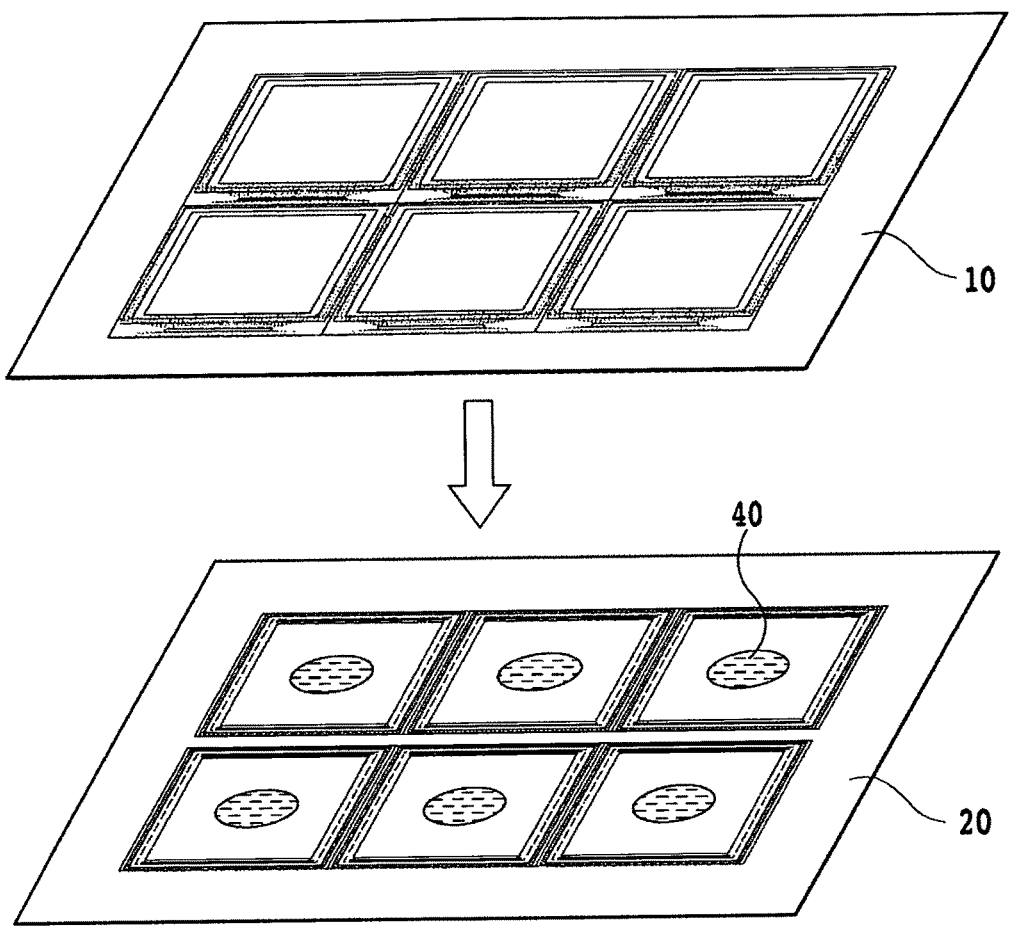
FIG. 25 is a conceptual diagram of multi-panel manufacturing of organic EL displays of the invention.

Another method for manufacturing organic EL displays of this invention includes a multi-panel manufacturing method. As shown in FIG. 24, this method includes a process of manufacturing a plurality of portions forming organic EL emission panels 10 on a single organic EL emission panel substrate 100, and a process of manufacturing a plurality of portions forming color conversion filter panels 20 on a single transparent substrate 200. In these processes, the portions forming organic EL emission panels 10 and the portions forming color conversion filter panels 20 are manufactured with respectively corresponding sizes and positions. Next, as shown in FIG. 25, these substrates are bonded together, to simultaneously manufacture a plurality of organic EL displays. Finally, by performing a process (9) of cutting and separating into individual organic EL displays, a plurality of organic EL displays are obtained from a pair of substrates.

PRACTICAL EXAMPLES

A more detailed explanation is given below using practical examples and comparative examples. In the following practical examples and comparative examples, the pixel pitch of the panels was made (60 μm×180 μm)×RGB.

Practical Example 1

Organic EL Emission Panel 10

TFT structures 102 for a plurality of screen portions were formed on an alkali-free glass substrate 100 of 200×200 mm×0.7 mm thick (product name AN-100, manufactured by Asahi Glass Co., Ltd.), the TFT structures 102 were covered with a planarization layer 103 comprising a resin layer of thickness 3 μm and an $SiO_2$ passivation layer of thickness 300 nm, and contact holes penetrating the planarization layer 103 and $SiO_2$ passivation layer were formed, to prepare an organic EL emission panel substrate 100.

A sputtering device (RF-planar magnetron) was used to deposit an IZO film of thickness 50 nm onto the organic EL emission panel substrate 100 in an Ar gas atmosphere, a resist (product name OFRP-800, manufactured by Tokyo Ohka Kogyo Co., Ltd.) was applied thereto, exposure and development were performed to form a pattern, and by performing wet etching, an underlayer 110 was formed, separated into island shapes at each subpixel. This underlayer 110 was connected to the TFT structures 102 through contact holes provided in the planarization layer 103 and inorganic passivation layer.

An Ag alloy was sputter-deposited to a thickness of 200 nm onto the underlayer 110, and a method similar to that of patterning of the underlayer 110 was used to perform patterning so that there was no protrusion from the underlayer 110, to form island-shape reflective electrodes 120.

A spin-coating method was used to apply a novolac system resin (product name JEM-700R2, manufactured by JSR Corp.) onto the substrate with the reflective electrodes 120 formed, and a photolithography method was used to provide 40 μm×160 μm opening portions, corresponding to subpixels, over the reflective electrodes 120, to form an insulating layer 111.

The substrate with the reflective electrodes 120 and insulating layer 111 formed was mounted in a resistive heating evaporation deposition device, and Li was layered to a thickness of 1.5 nm on the reflective electrodes 120 to form a cathode buffer layer. Then, the device interior was depressurized to $1 \times 10^{-4}$ Pa, and an electron transport layer, organic emission layer, hole transport layer, and hole injection layer were layered, in sequence, at an evaporation deposition rate of 0.1 nm/sec while maintaining the vacuum, to form an organic EL layer 130.

As the electron transport layer, tris (8-hydroxyquinolinato) aluminum ($Alq_3$) was layered to a film thickness of 20 nm; as the organic emission layer, 4,4'-bis (2,2'-diphenylvinyl) biphenyl (DPVBi) was layered to a film thickness of 30 nm; as the hole transport layer, 4,4'-bis [N-(1-naphthyl)-N-phenylamino] biphenyl (α-NPD) was layered to a film thickness of 10 nm; and as the hole injection layer, copper phthalocyanine (CuPc) was layered to a film thickness of 100 nm.

MgAg was evaporation-deposited to a thickness of 5 nm onto the organic EL layer 130, as a damage mitigation layer during sputter deposition of the transparent electrode 140. Next, while maintaining the vacuum, the substrate with the damage mitigation layer formed was moved to a facing sputtering device. Using a metal mask having opening portions corresponding to the screen regions, an IZO film was sputter-deposited to a thickness of 200 nm, to form the transparent electrodes 140. Further, while maintaining the vacuum, the substrate with the transparent electrodes 140 formed was moved to a CVD device, and SiN was deposited over the entire face to a thickness of 2 μm to cover [the face] with an inorganic barrier layer 150. Further, FPC mounting terminals 80 and panel internal wiring 90 were placed in the frame portions, to simultaneously manufacture a plurality of organic EL emission panels 10, as shown in FIG. 24.

(Color Conversion Filter Panel 20)

A black matrix material (product name CK-7001, manufactured by Fuji Film Arch Co., Ltd.) was applied onto a 200×200 nm×0.7 nm thick alkali-free glass substrate (product name Eagle 2000, manufactured by Corning Inc.) 200. Next, a photolithography method was used to form a vertical-horizontal mesh-shape black matrix 211, having opening portions with a horizontal-direction pitch of 60 μm×a vertical-direction pitch of 180 μm, and a horizontal-direction width of 40 μm×a vertical-direction length of 160 μm. The black matrix 211 had a thickness of 1 μm.

As color filter materials, red (product name CR-7001, available from Fujifilm Corp.), green (product name CG-7001, available from Fujifilm Corp.), and green (product name CB-7001, available from Fujifilm Corp.) color filter materials were used, and color filters 210 were formed. The color filters 210 for each color were patterned using a photolithography method, formed from a plurality of stripe-shaped portions of thickness 1.5 μm, comprising a repetition of RGB colors covering the opening portions provided in the black matrix 211 along the vertical mesh of the black matrix 211.

Next, a photosensitive resin (product name CR-600, manufactured by Hitachi Chemical Co., Ltd.) was applied, and patterning performed using a photolithography method, to form stripe-shaped barrier walls for inkjet application 221 on the vertical-direction mesh of the black matrix 211, extending along the color filters 210 of width 14 μm and height 5 μm, as shown in FIG. 13. Simultaneously, filler material guide walls 50 of width 14 μm, height 5 μm, and length approximately 44 mm were formed in three rows with a pitch of 180 μm from both tip portions of the barrier walls for inkjet application 221, with an interval therebetween of approximately 1.5 mm, as shown in FIG. 7. Further, a peripheral seal wall 310 of width 14 μm and height 5 μm was simultaneously formed along the entire perimeter of the panel, removed approximately 0.5 mm to the periphery on the outside of the filler material barrier walls 50. Further, the above-described photosensitive resin was applied, and patterning performed using a photolithography method, to form a plurality of spacers 60 on the barrier walls for inkjet application 221 of diameter approximately 15 μm and height 12 μm, and heating and drying were performed. Each of the spacers 60 was placed in a position so as to be hidden by the black matrix.

The above panel was set in a multi-nozzle type inkjet device with an impact precision of ±5 μm, placed on a nitrogen atmosphere in which oxygen and water were each at 50 ppm or lower, and was positioned using markers fabricated using black matrix material.

The inkjet device was made to perform scanning, and red and green color conversion material inks were dispensed aiming at the center portions of the gaps between the barrier walls for inkjet application 221, to apply the respective inks onto the red and green color filters 210(R,G), after which, while maintaining the nitrogen atmosphere, drying was performed at a temperature of 100° C., and flat stripe-shaped red and green color conversion layers 220(R,G) were formed on the red and green color filters 210(R,G), as shown in FIG. 13. The red and green color conversion layers 220(R,G) each had a film thickness of 500 nm. In this practical example, formation of a blue color conversion layer 220B was omitted. During ink application, no color mixing due to ink crossing barrier walls for inkjet application 221 was observed, and color mixing at both end portions of the barrier walls for inkjet application 221 also remained within the range of formation of the black matrix 211.

As the red color conversion material ink, a solution obtained by dissolving 50 parts by weight of a mixture of a first dye, coumarin 6, and a second dye, DCM (molar ratio: coumarin 6/DCM=48/2) in 1000 parts by weight toluene was used, and three drops per subpixel (one drop: approximately 14 pl) were dispensed.

On the other hand, as green color conversion material ink, a solution obtained by dissolving 50 parts by weight of a mixture of a first dye, coumarin 6, and a second dye, DEQ (molar ratio: coumarin 6/DEQ=48/2) in 1000 parts by weight toluene was used, and three drops per subpixel (one drop: approximately 14 pl) were dispensed.

The panel with up to the color conversion layers 220(R,G) formed was transferred to a CVD device while maintaining the nitrogen atmosphere, a SiN film of thickness 2 μm was deposited to form an inorganic barrier layer 230, and a plurality of color conversion filter panels 20 having the cross-sectional structure shown in FIG. 13 were manufactured on a single glass substrate 200, as shown in FIG. 24.

Figure 16:
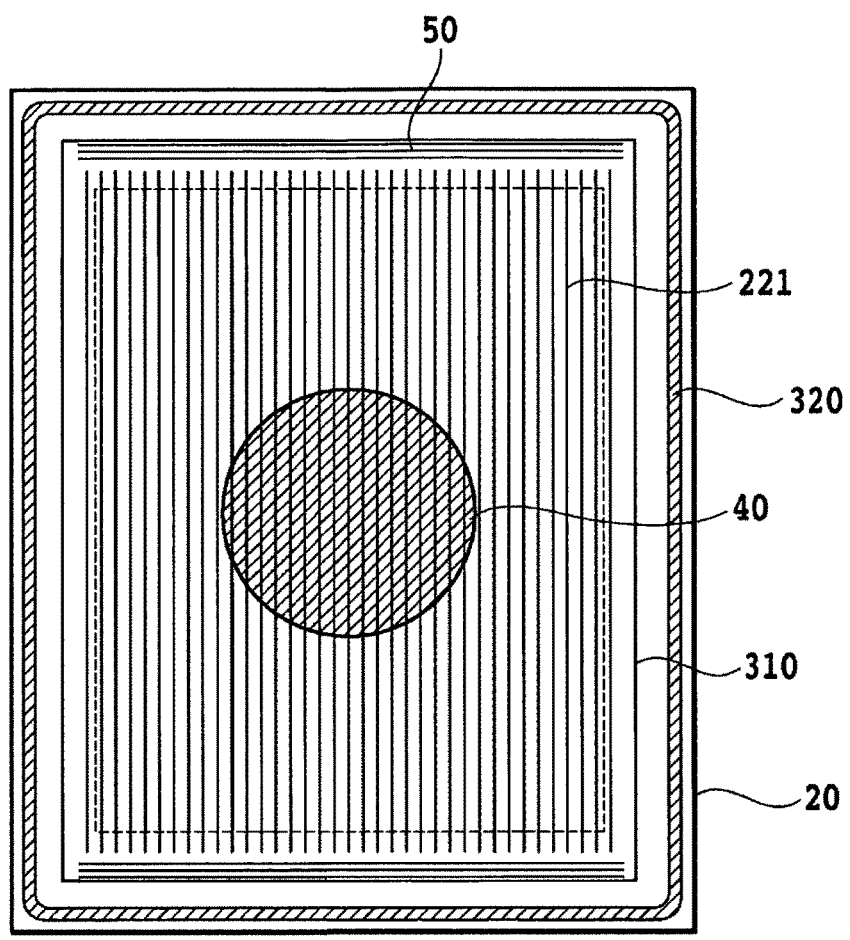
FIG. 16 is a plane view showing one mode of the initial positioning of filler material, when bonding an organic EL emission panel and a color conversion filter panel in the invention.
Figure 17:
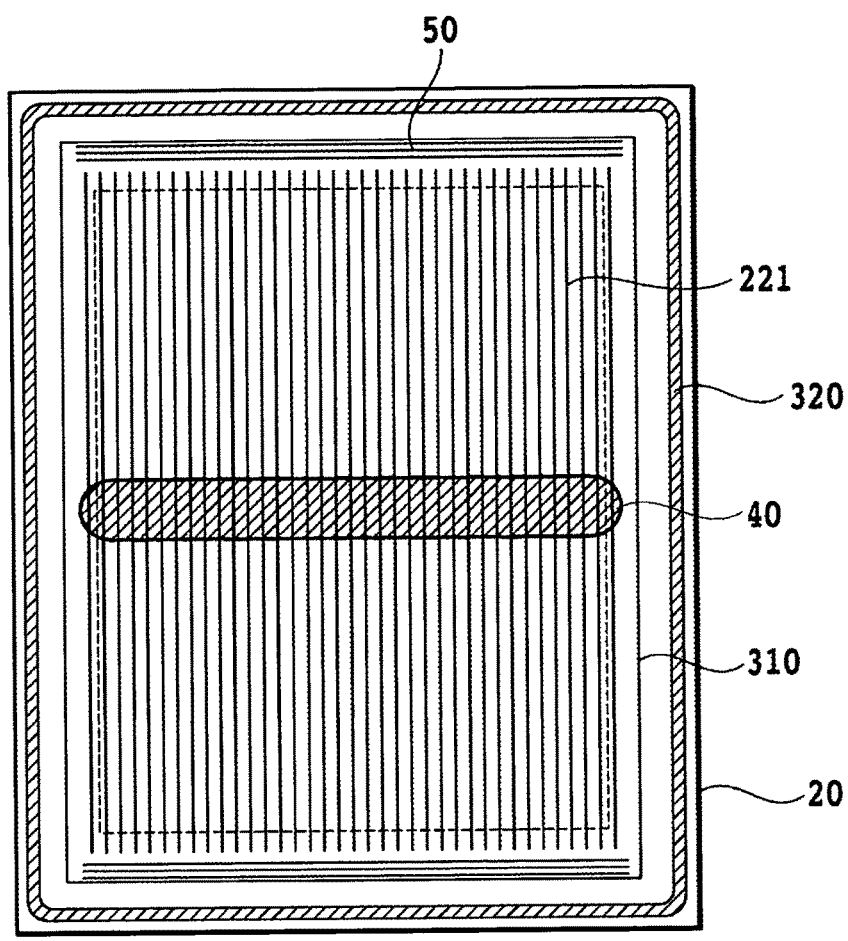
FIG. 17 is a plane view showing another mode of the initial positioning of filler material, when bonding an organic EL emission panel and a color conversion filter panel in the invention.

The manufactured organic EL emission panels 10 and color conversion filter panels 20 were transferred to a bonding device maintained at an atmosphere in which oxygen and water were each at 5 ppm or lower, and the color conversion filter panels 20 were set with the light-receiving faces directed upward. An epoxy system ultraviolet-hardening adhesive (product name XNR-5516, manufactured by Nagase ChemteX Corp.) was applied using a dispenser, as the peripheral seal material 320, to the outside of the peripheral seal walls 310 of each of the plurality of color conversion filter panels 20. Next, as shown in FIG. 16 and FIG. 24, a rotating-type mechanical measurement valve was used to drop a thermosetting type epoxy system adhesive 40, with viscosity lower than that of the above-described epoxy system ultraviolet-hardening adhesive, into the center portions of the color pattern formation regions as the resin filler material 40, with a dispensing precision within 5%.

As shown in FIG. 25, the organic EL emission panels 10 were set with the emission faces directed downward, and the device interior was depressurized to approximately 10 Pa. The panels were brought into proximity in parallel, with the distance between faces reduced to approximately 30 μm, and in a state in which the entire perimeters of the unhardened peripheral seal material 320 were in contact with the organic EL emission panel substrate 100, positioning of the panels was performed. Next, the interior of the device was gradually returned to atmospheric pressure, and simultaneously a slight load was added, causing the process face of the organic EL emission panel 10 to come into contact with the apexes of the spacers 60.

At this time, the thermosetting type epoxy system adhesive used as the resin filler material 40 flowed mainly along the barrier walls for inkjet application 221 as shown in FIG. 20 and FIG. 21, and the direction of flow was changed at the end portions thereof by the filler material guide walls 50, to spread up to the periphery portion.

A mask was used to irradiate and temporarily harden the peripheral seal material 320 with ultraviolet rays from the side of the transparent substrate 200 of the color conversion filter panels 20, and [the panels] were then removed into the ordinary environment. As a result of observations of the bonded panels, the resin filler material 40 comprising thermosetting type adhesive had spread through the entire panel faces without excess or deficiency, and no residual air bubbles within the screens or seal rupture of the peripheral seal members 30 were observed.

Using an automated glass scriber device (manufactured by Mitsuboshi Diamond Industrial Co., Ltd.) and a breaking device (manufactured by Mitsuboshi Diamond Industrial Co., Ltd.), division into individual panels was performed, and heating for one hour at 80° C. in a heating furnace was performed, followed by natural cooling for 30 minutes in the furnace.

The divided panels were set in a dry etching device, the 2 μm thick inorganic barrier layer 150 covering portions for pads to connect FPC mounting terminals 80 and control ICs 70 was removed, and a plurality of top-emission type organic EL displays were manufactured simultaneously.

Comparative Example 1

Except for omitting formation of resin material guide walls 50 during manufacture of the color conversion filter panels 20 in Practical Example 1 above, processing similar to that of Practical Example 1 was performed, to simultaneously manufacture a plurality of organic EL displays.

In this comparative example, when bonding together the organic EL emission panels 10 and the color conversion filter panels 20, not only was seal rupture observed in which the thermosetting type adhesive 40 passed the peripheral seal members 30, as shown in FIG. 26, but unfilled portions were observed in which the resin filler material 40 did not reach the four corner portions of the regions within the peripheral seal members 30.

Comparative Example 2

Except for forming the barrier walls for inkjet application 221 in a vertical-horizontal mesh shape as shown in FIG. 2 during manufacture of the color conversion filter panels 20 in Practical Example 1 above, processing similar to that of Practical Example 1 was performed, to simultaneously manufacture a plurality of organic EL displays.

Figure 3:
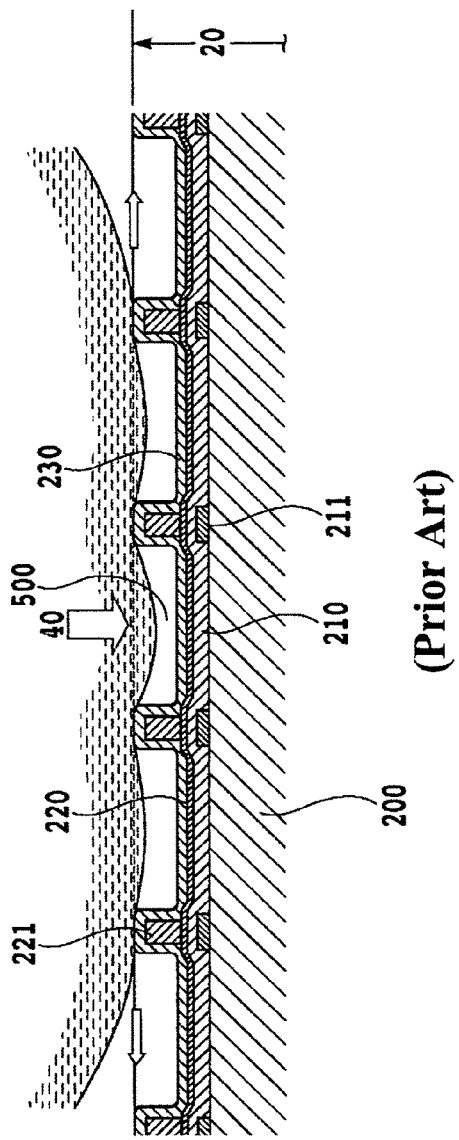
FIG. 3 is an elevation view showing the state of application of a resin filler material to the color conversion filter panel in Comparative Example 2, belonging to the prior art.

In this comparative example, when bonding together the organic EL emission panels 10 and the color conversion filter panels 20, incomplete filling in each of the subpixels by the thermosetting type adhesive 40, as shown in FIG. 3, and remaining air bubbles, were observed. Further, as shown in FIG. 4, impeding of the flow of the thermosetting type adhesive 40 by the mesh-shape barrier walls for inkjet application 221 was observed.

Practical Example 2

Figure 4:
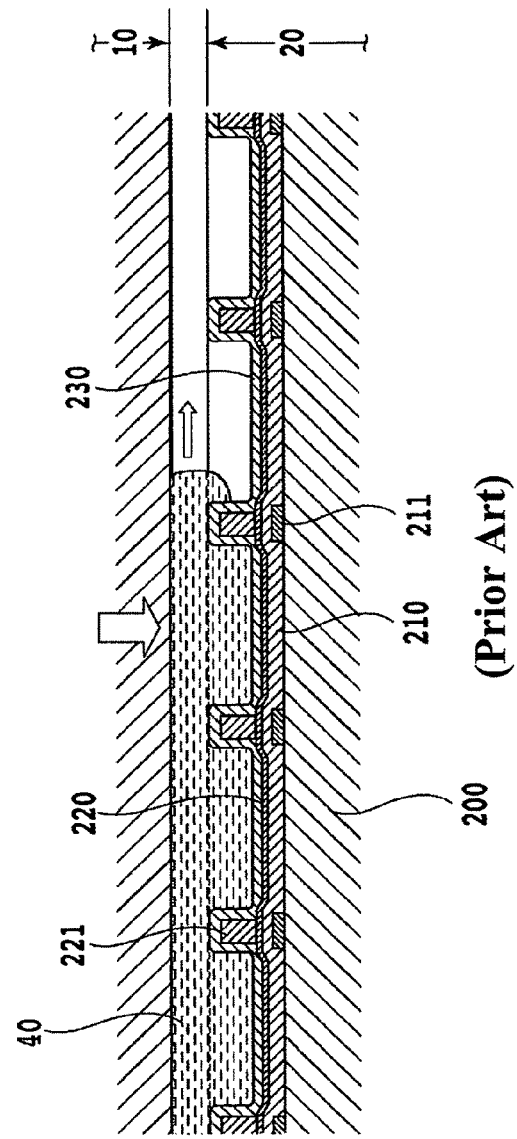
FIG. 4 is an elevation view showing the flow of filler material, during bonding of the organic EL emission panel and the color conversion filter panel in Comparative Example 2, belonging to the prior art.
Figure 18:
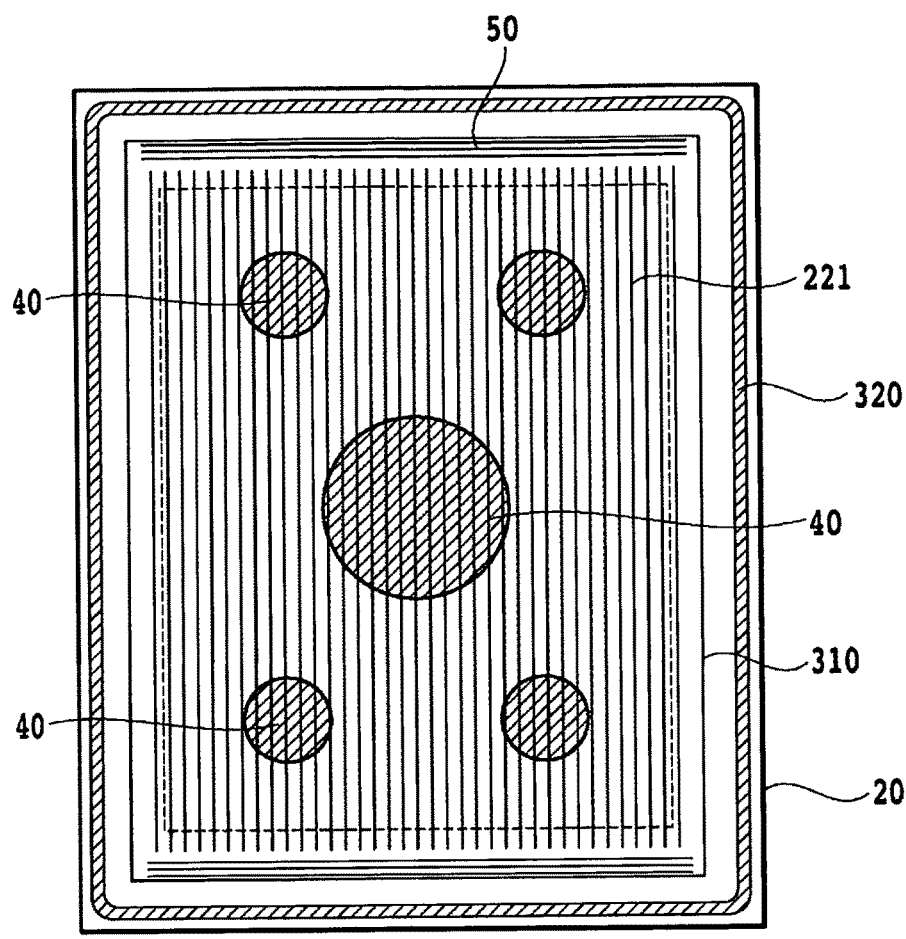
FIG. 18 is a plane view showing another mode of the initial positioning of filler material, when bonding an organic EL emission panel and a color conversion filter panel in the invention.

Processing similar to that of Practical Example 1 was performed to simultaneously manufacture a plurality of organic EL displays except for, during manufacture of the color conversion filter panels 20 in Practical Example 1 above, dividing the filler material guide wall 50 into five equal portions and arranging them intermittently at intervals of approximately 1 mm as shown in FIG. 4, and placing the thermosetting type adhesive 40 at multiple points as shown in FIG. 18 when bonding together the organic EL emission panels 10 and the color conversion filter panels 20.

In this practical example, satisfactory organic EL displays similar to those of Practical Example 1 were obtained.

Practical Example 3

Except for forming filler material guide walls 50 having bent portions, and using a resin filler material with a viscosity of from 200 to 500 mPa·s, processing similar to that of Practical Example 1 was performed, to simultaneously manufacture a plurality of organic EL displays.

The resin material guide walls 50 were formed in three rows with a pitch of 180 μm, taking an interval of approximately 1.5 mm from both tip portions of the barrier walls for inkjet application 221. Each of the rows of filler material guide walls 50 had a width of 14 μm and a height of 5 μm. The rows of filler material guide walls 50 had lengths, in order from the side of the barrier walls for inkjet application 221, of 15 mm, 22 mm, and 35 mm. And, bent portions of length 5 mm were formed from both ends of each of the rows of the filler material guide walls 50, with each of the bent portions directed in the direction of the closest corner of the peripheral seal wall 310.

In this practical example, despite the fact that a resin filler material 40 of higher viscosity was used, satisfactory organic EL displays similar to those of Practical Example 1 were obtained.

Figure 1B:
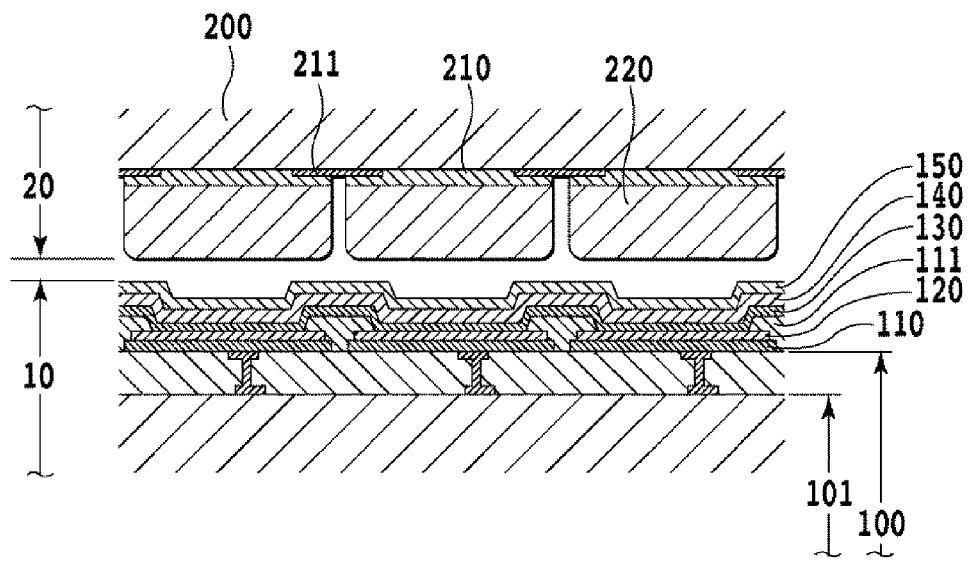
FIG. 1B is a cross-sectional view along section line IB-IB of the pixel portion of the top-emission type organic EL display of the prior art.
Figure 1C:
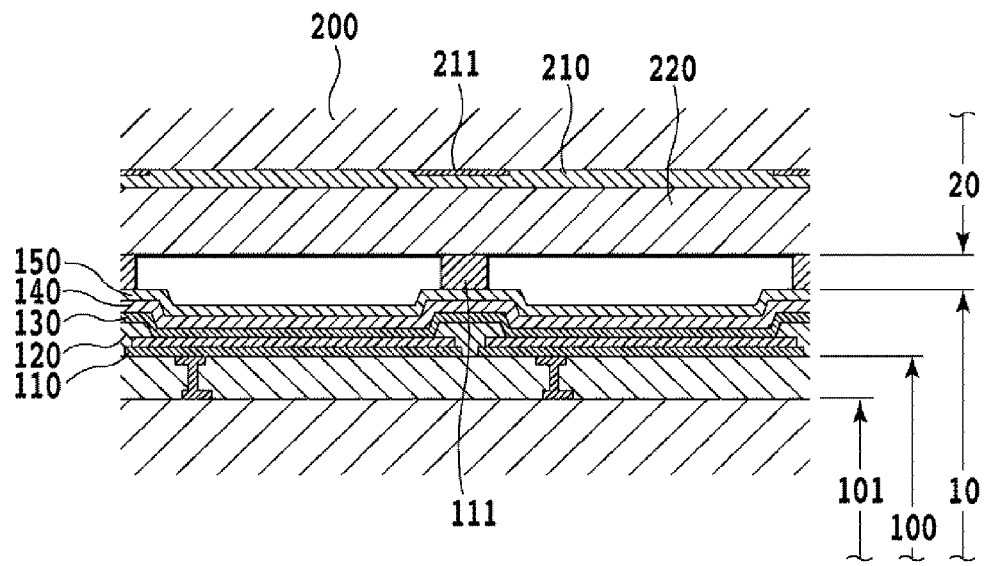
FIG. 1C is a cross-sectional view along section line IC-IC of the pixel portion of the top-emission type organic EL display of the prior art.

FIG. 1A
(PRIOR ART)
FIG. 1B
(PRIOR ART)
FIG. 2
(PRIOR ART)
FIG. 3
(PRIOR ART)
FIG. 4
(PRIOR ART)
FIG. 5A
DISPLAY SCREEN
FIG. 5B
DISPLAY SCREEN
FIG. 6
TFT PATTERN REGION
EL EMISSION REGION
FIG. 7
BLACK MATRIX FORMATION REGION
COLOR PATTERN FORMATION REGION (SCREEN REGION)
FIG. 8
BLACK MATRIX FORMATION REGION
COLOR PATTERN FORMATION REGION (SCREEN REGION)
FIG. 21
DIRECTION OF FLOW OF SEAL MATERIAL
FIG. 26
UNFILLED PORTION
SEAL RUPTURE

The invention claimed is:

1. A top-emission organic EL display, comprising:
an organic EL emission panel; and
a color conversion filter panel bonded together with the organic EL emission panel,
wherein the organic EL emission panel includes a substrate having an emission face, and a reflective electrode, an organic EL layer, and a transparent electrode that are provided on the emission face in this order,
wherein the color conversion filter panel includes a transparent substrate having a light-receiving face, and also includes, on the light-receiving face, a plurality of stripe-shaped barrier walls for inkjet application, and a color conversion layer formed between the barrier walls for inkjet application,
wherein one of the organic EL emission panel and the color conversion filter panel further includes an elongated filler material guide wall having a length direction that is perpendicular to the length direction of the barrier walls for inkjet application, and
wherein the organic EL emission panel and the color conversion filter panel are bonded together with a resin filler material such that the emission face and the light-receiving face are opposed, and the periphery of the resin filler material, barrier walls for inkjet application, and filler material guide wall is sealed by a peripheral seal member.

2. The organic EL display according to claim 1, wherein the filler material guide wall comprises one row of a barrier wall.

3. The organic EL display according to claim 2, wherein the one row of the barrier wall is continuous.

4. The organic EL display according to claim 2, wherein the one row of the barrier wall is intermittent.

5. The organic EL display according to claim 2, wherein the one row of the barrier wall has bent portions at both ends thereof, and wherein the bent portions are directed toward four corners of the peripheral seal member.

6. The organic EL display according to claim 1, wherein the filler material guide wall comprises a set of a plurality of rows of barrier walls.

7. The organic EL display according to claim 6, wherein each of the plurality of rows of barrier walls is continuous.

8. The organic EL display according to claim 6, wherein each of the plurality of rows of barrier walls is intermittent.

9. The organic EL display according to claim 6, wherein the lengths of the plurality of rows of barrier walls increase from the barrier walls for inkjet application toward the peripheral seal member.

10. The organic EL display according to claim 9, wherein each of the plurality of rows of barrier walls has bent portions on both ends thereof, and wherein the bent portions are directed toward four corners of the peripheral seal member.

11. The organic EL display according to claim 1, wherein the filler material guide wall is disposed on the color conversion filter panel.

12. The organic EL display according to claim 11, wherein the barrier walls for inkjet application and the filler material guide wall are formed using the same material and the same process.

13. The organic EL display according to claim 1, wherein the peripheral seal member is formed from a peripheral seal wall formed on one of the organic EL emission panel and the color conversion filter panel, and a peripheral seal material positioned on the outside of the peripheral seal wall.

14. The organic EL display according to claim 13, wherein the peripheral seal wall is disposed on the color conversion filter panel.

15. The organic EL display according to claim 14, wherein the barrier walls for inkjet application are placed on the color conversion filter panel, and wherein the barrier walls for inkjet application, filler material guide wall, and peripheral seal wall are formed using the same material and the same process.

16. The organic EL display according to claim 1, wherein the resin filler material comprises a thermosetting transparent resin adhesive.

17. The organic EL display according to claim 1, wherein the barrier walls for inkjet application extend to the outside by at least one pixel length from both ends of a screen region including the color conversion layer.

18. The organic EL display according to claim 1, wherein the filler material guide wall has first and second ends that are spaced apart from one another, and is continuous between the first and second ends.

* * * * *